US012438692B2

(12) United States Patent
Ochiai

(10) Patent No.: US 12,438,692 B2
(45) Date of Patent: Oct. 7, 2025

(54) TRANSMISSION DEVICE AND COMMUNICATION SYSTEM

(71) Applicant: SONY SEMICONDUCTOR SOLUTIONS CORPORATION, Kanagawa (JP)

(72) Inventor: Yasuhiro Ochiai, Kanagawa (JP)

(73) Assignee: SONY SEMICONDUCTOR MANUFACTURING CORPORATION, Kanagawa (JP)

( * ) Notice: Subject to any disclaimer, the term of this patent is extended or adjusted under 35 U.S.C. 154(b) by 136 days.

(21) Appl. No.: 18/262,388

(22) PCT Filed: Dec. 23, 2021

(86) PCT No.: PCT/JP2021/047981
§ 371 (c)(1),
(2) Date: Jul. 21, 2023

(87) PCT Pub. No.: WO2022/163246
PCT Pub. Date: Aug. 4, 2022

(65) Prior Publication Data
US 2024/0080177 A1    Mar. 7, 2024

(30) Foreign Application Priority Data
Jan. 29, 2021   (JP) ................. 2021-013768

(51) Int. Cl.
*H04L 7/033*    (2006.01)
*H03K 5/01*    (2006.01)
*H03K 5/00*    (2006.01)

(52) U.S. Cl.
CPC .............. *H04L 7/033* (2013.01); *H03K 5/01* (2013.01); *H03K 2005/00078* (2013.01)

(58) Field of Classification Search
CPC ....................................................... H04L 7/033
(Continued)

(56) References Cited

U.S. PATENT DOCUMENTS 3,732,507 A  *  5/1973  Christiansen ............ H03B 5/26
                                                          323/318
4,918,296 A  *  4/1990  Fujisaka ............... G06K 7/0008
                                                          235/375
(Continued)

FOREIGN PATENT DOCUMENTS

JP        04-070913 A    3/1992
JP        11-026593 A    1/1999
(Continued)

OTHER PUBLICATIONS

International Search Report and Written Opinion of PCT Application No. PCT/JP2021/047981, issued on Feb. 22, 2022, 09 pages of ISRWO.

*Primary Examiner* — Lihong Yu
(74) *Attorney, Agent, or Firm* — CHIP LAW GROUP

(57) ABSTRACT

A transmission device according to the present disclosure includes: a driver that transmits a transmission signal including two or more signals; an alternating current signal generator including a phase-locked loop circuit that generates an alternating current signal, the alternating current signal generator being configured to set a phase and frequency of the alternating current signal; an amplifier configured to amplify the alternating current signal generated by the alternating current signal generator and set amplitude of the alternating current signal; and a superimposer that superimposes the alternating current signal amplified by the amplifier on the two or more signals.

18 Claims, 21 Drawing Sheets

(58) Field of Classification Search
USPC .......................................................... 375/354
See application file for complete search history.

(56) References Cited

U.S. PATENT DOCUMENTS

| | | | | |
|---|---|---|---|---|
| 5,739,677 | A | * | 4/1998 | Tsutsui ...................... H02J 7/24 |
| | | | | 322/20 |
| 2004/0026716 | A1 | * | 2/2004 | Ishimatsu ............. H01L 23/528 |
| | | | | 257/E23.151 |
| 2005/0024112 | A1 | * | 2/2005 | Keaveney ............. H03L 7/0896 |
| | | | | 327/172 |
| 2007/0121771 | A1 | * | 5/2007 | Yamada .................... G06F 1/04 |
| | | | | 375/362 |
| 2013/0285261 | A1 | * | 10/2013 | Tan ........................ H01L 25/18 |
| | | | | 257/777 |
| 2019/0207557 | A1 | * | 7/2019 | Rocheleau ........... H03H 9/2447 |

FOREIGN PATENT DOCUMENTS

| | | |
|---|---|---|
| JP | 2013-247437 A | 12/2013 |
| JP | 2017-516353 A | 6/2017 |
| WO | 2018/074251 A1 | 4/2018 |

* cited by examiner

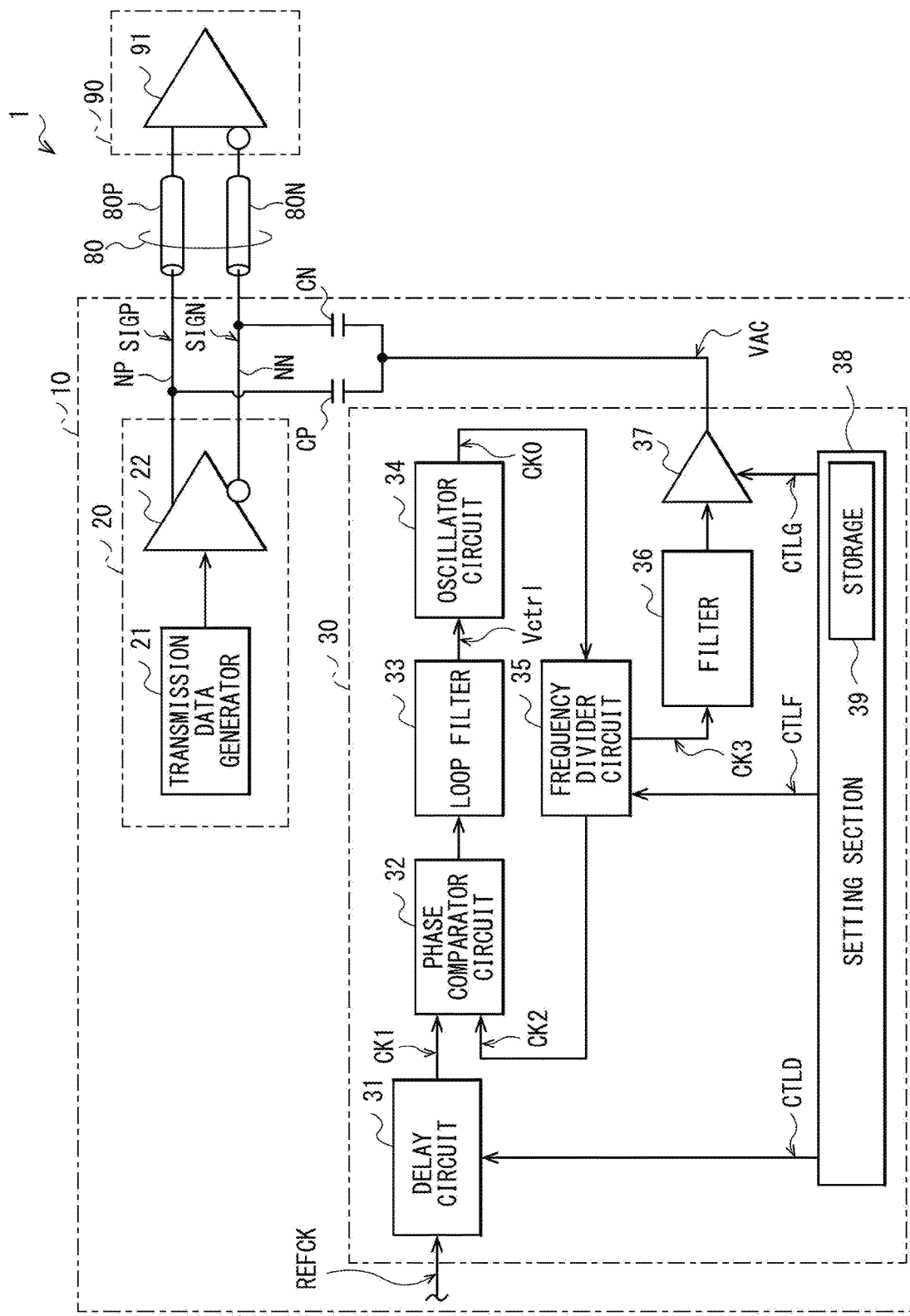
[FIG. 1]

[FIG. 2A]
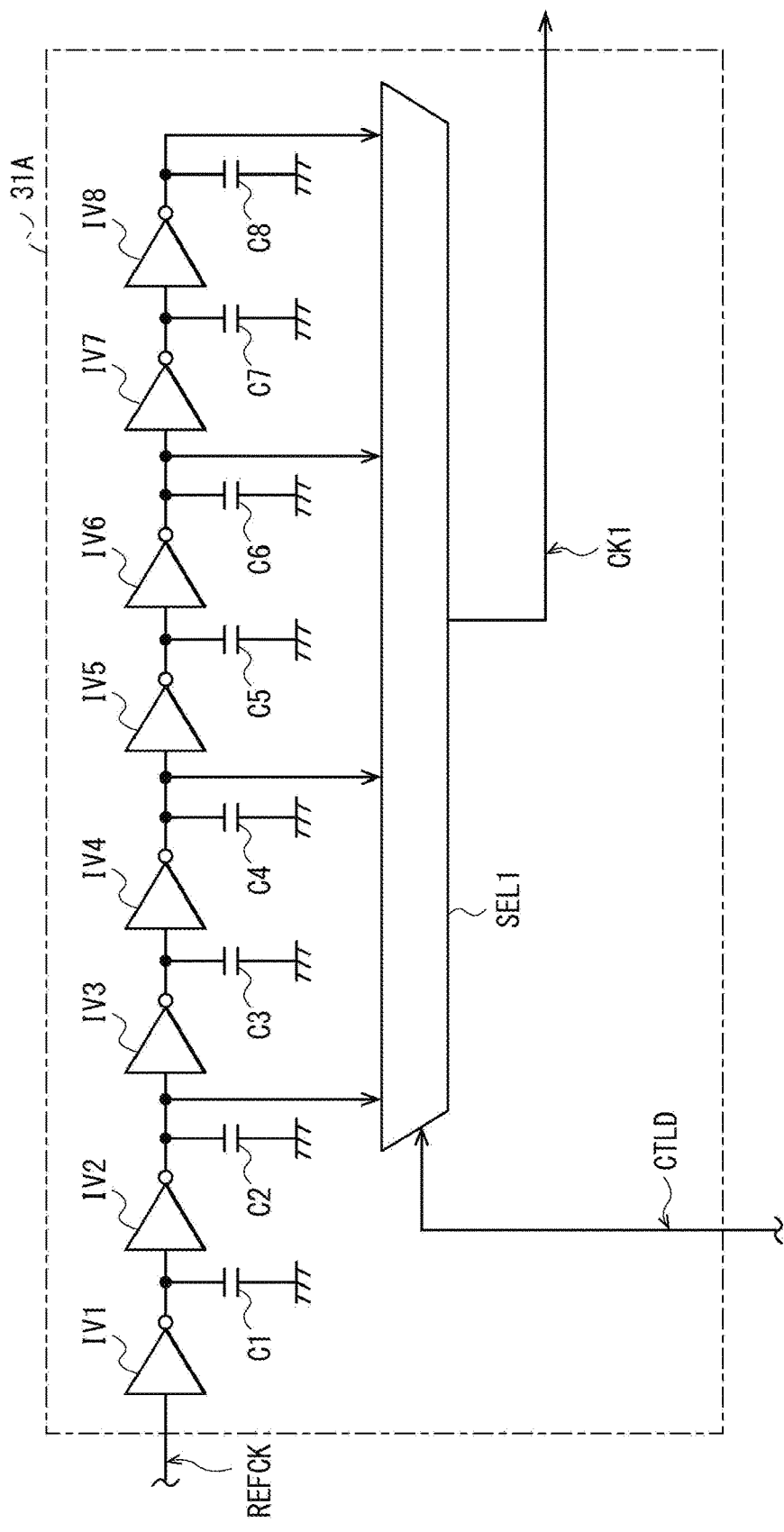

[FIG. 2B]
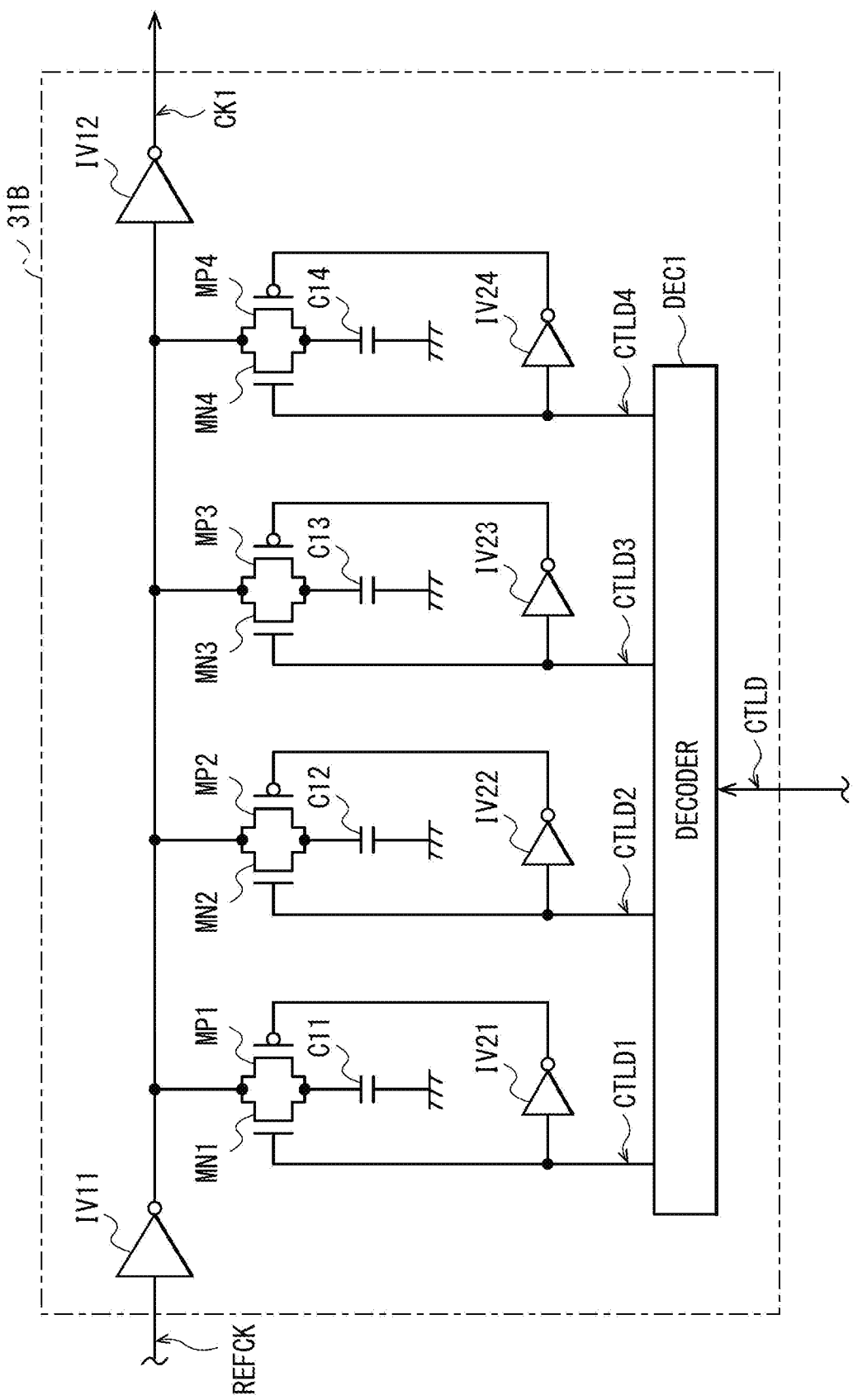

[FIG. 3]
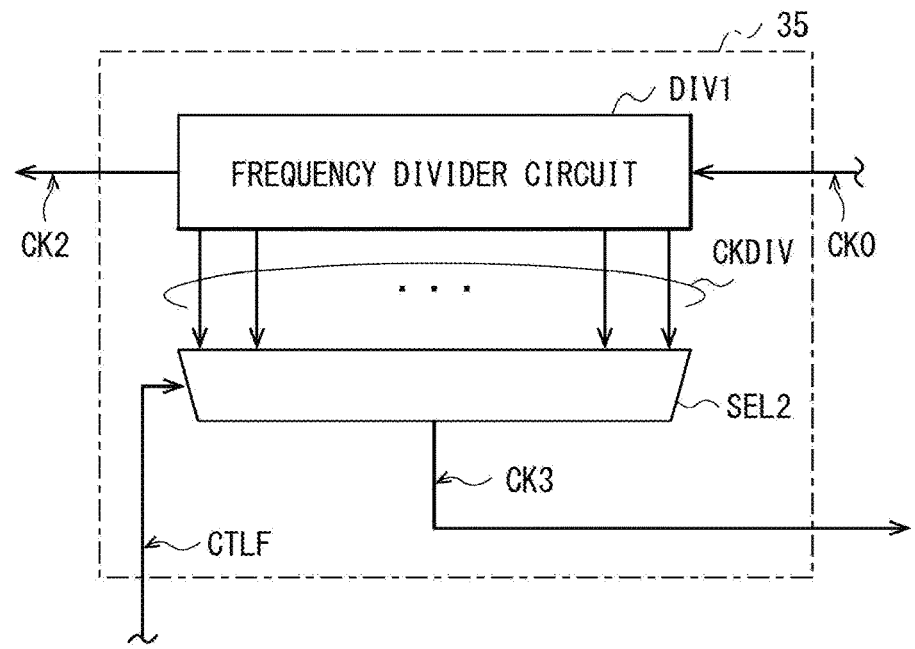
[FIG. 4A]
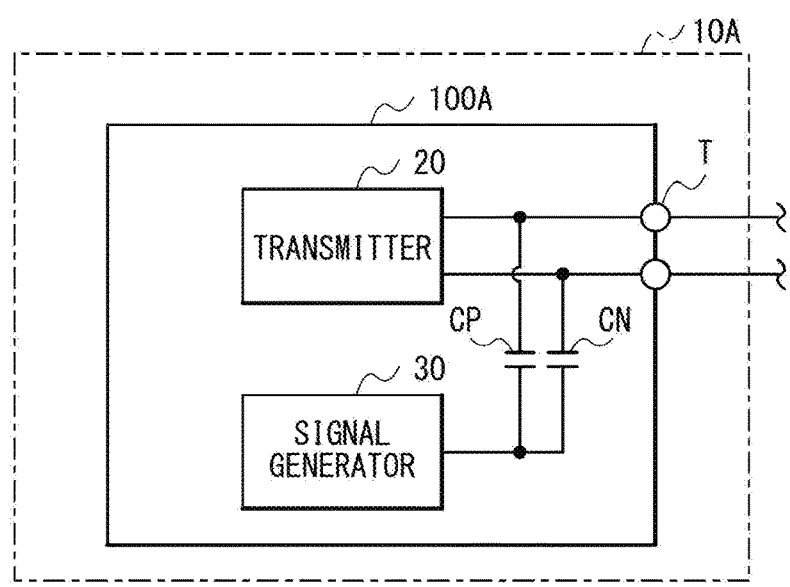

[FIG. 4B]
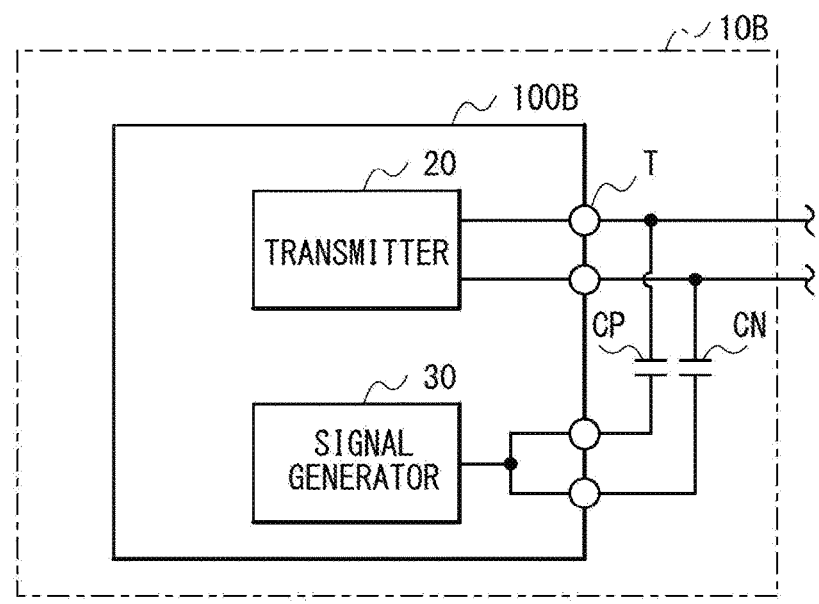
[FIG. 4C]
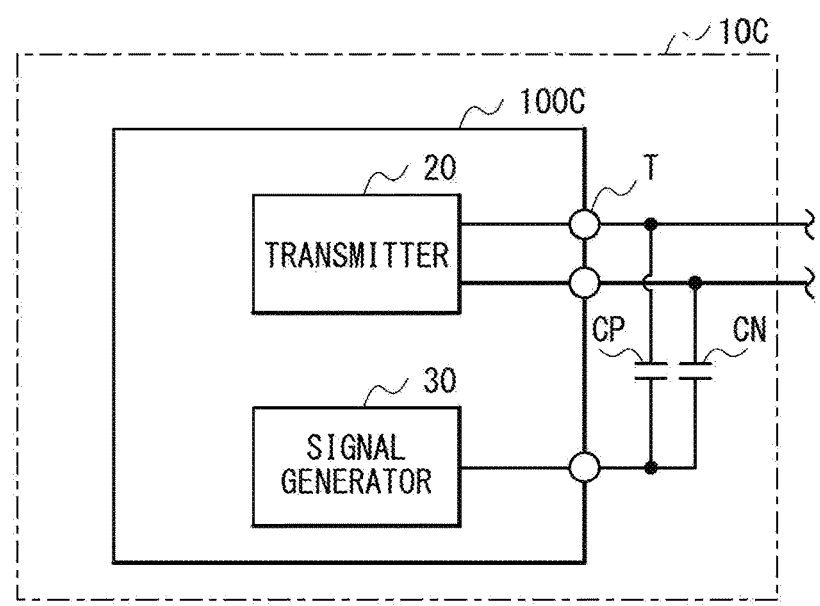

[FIG. 4D]
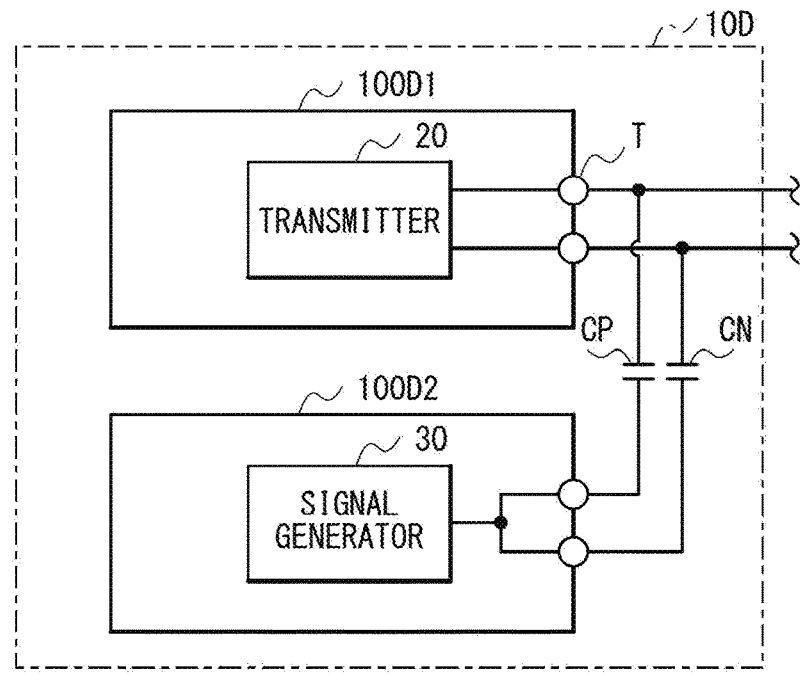
[FIG. 4E]
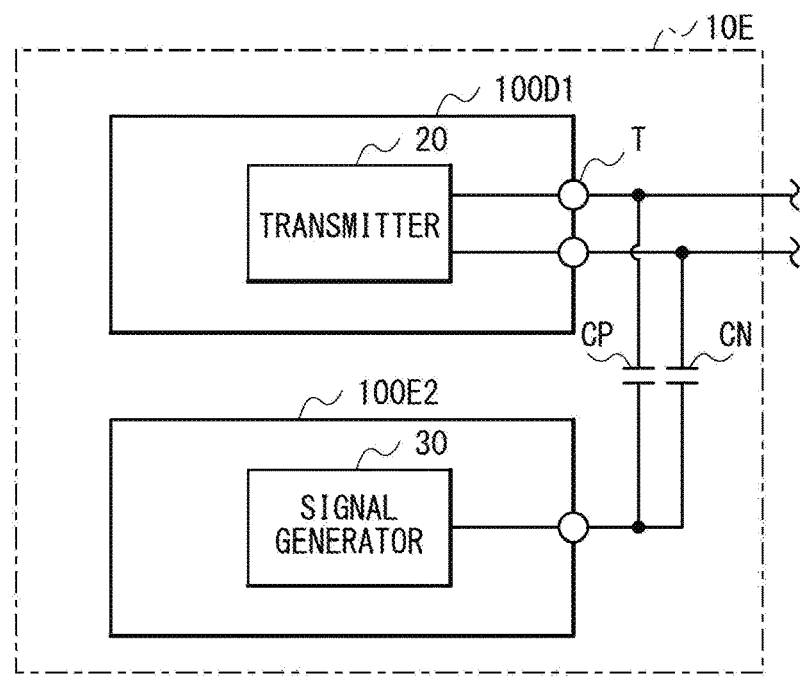

[FIG. 5]
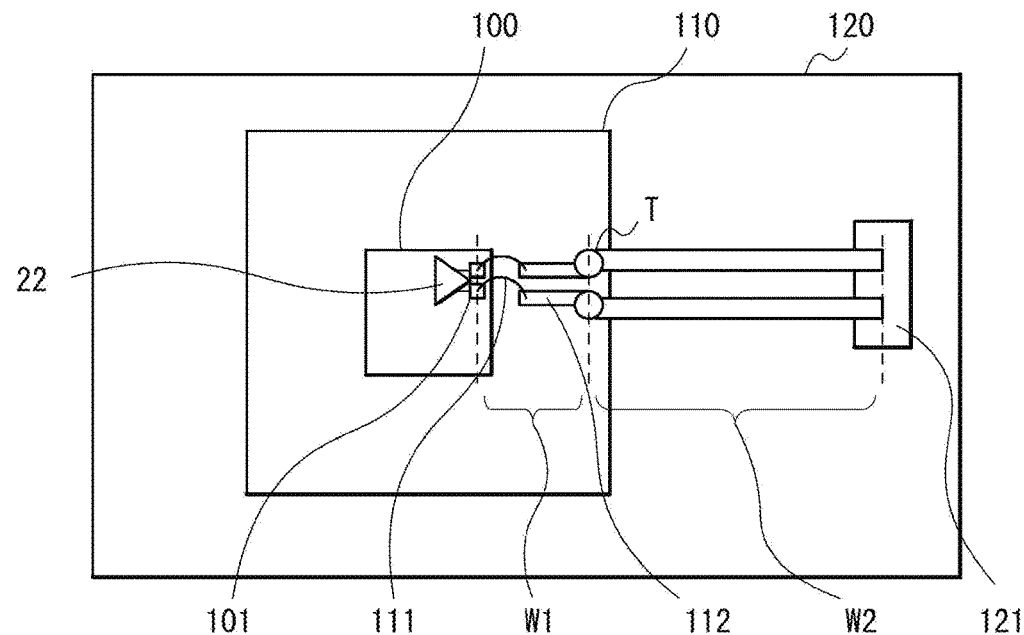
[FIG. 6]
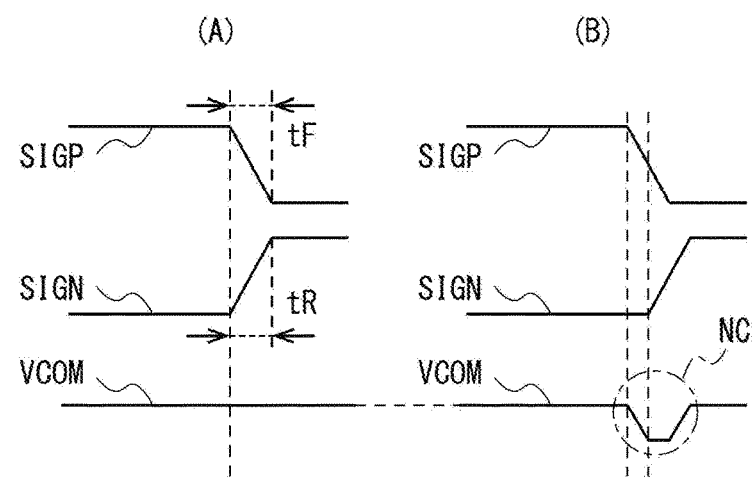

[FIG. 7]
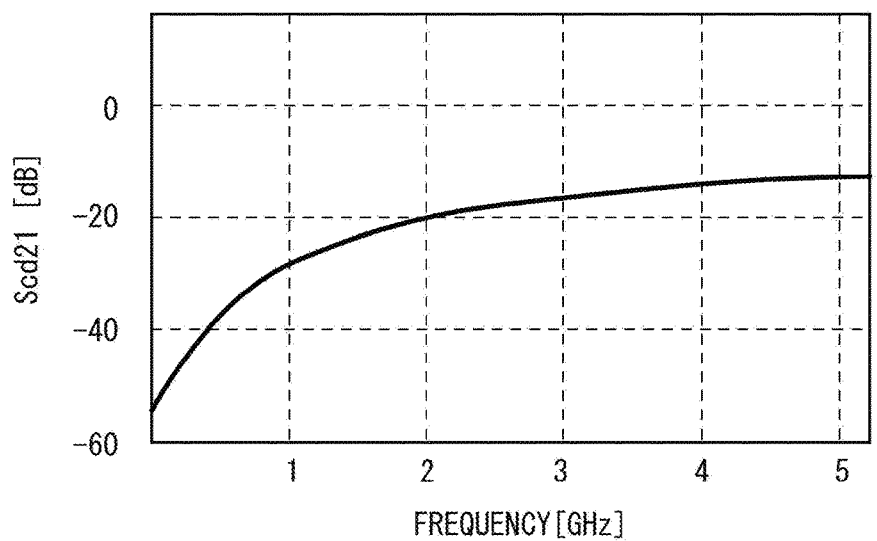
[FIG. 8]
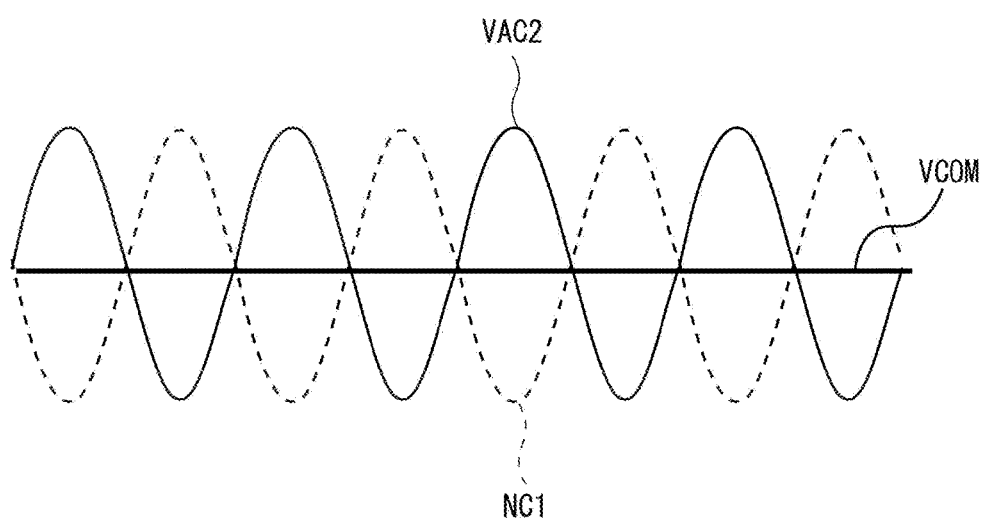

[FIG. 9]
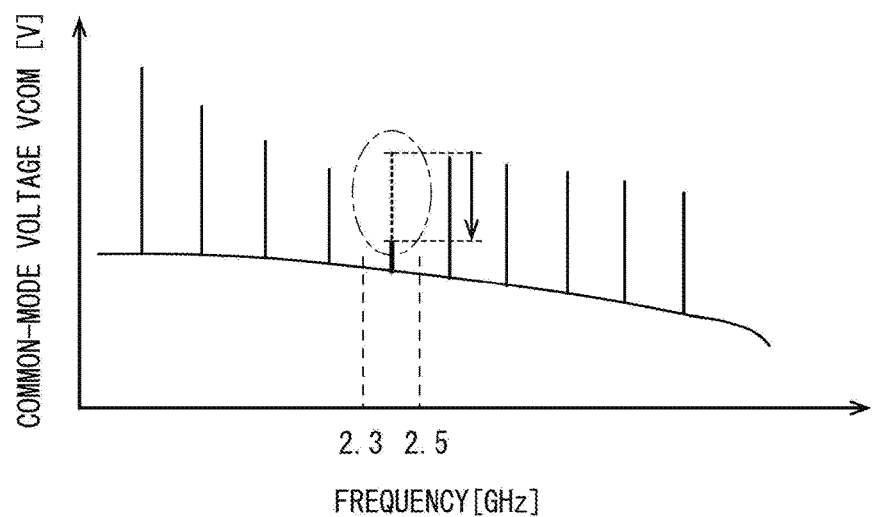
[FIG. 10]
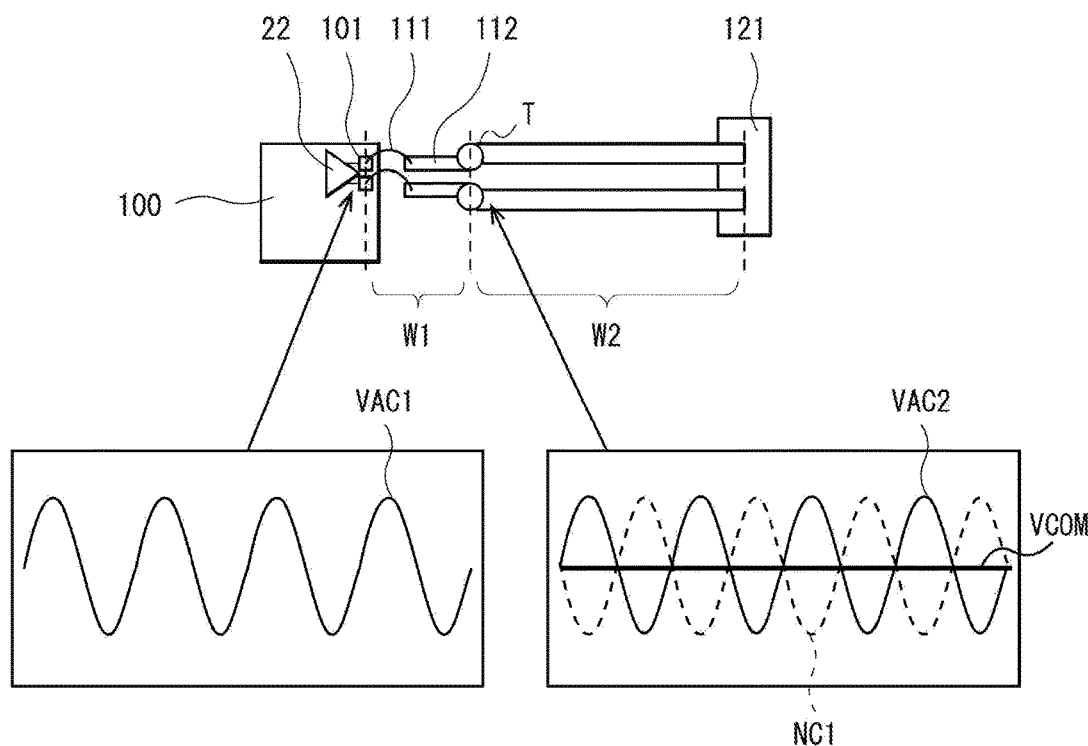

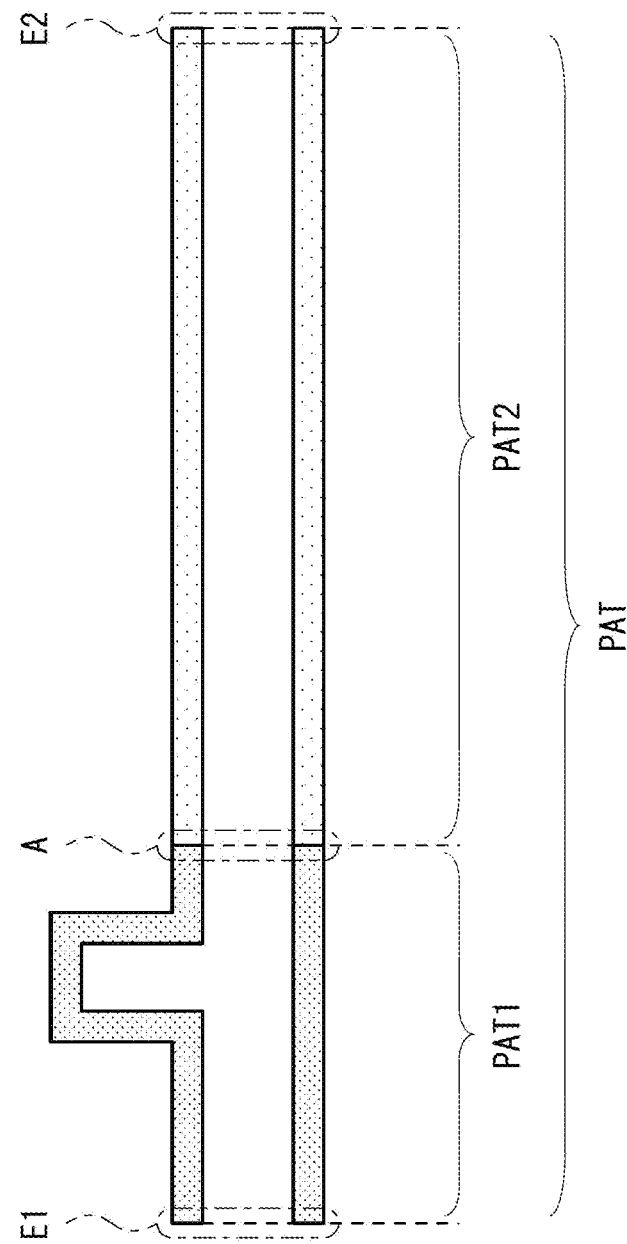
[FIG. 11]

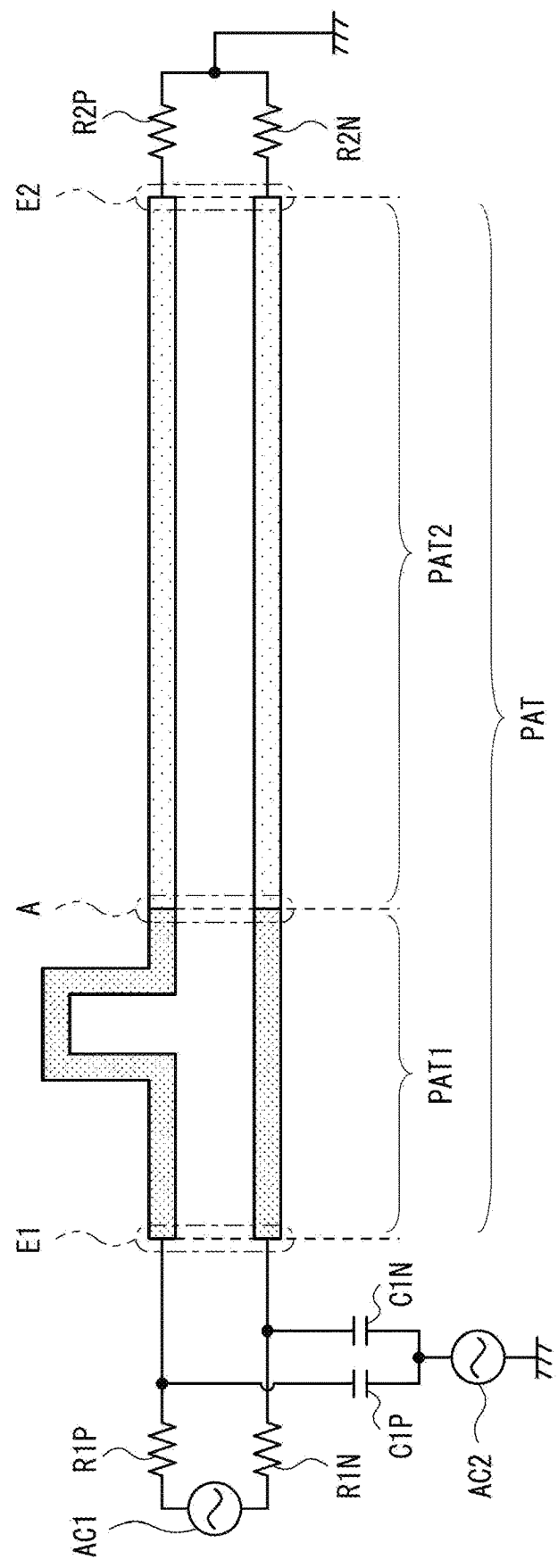
[FIG. 12]

[FIG. 13]
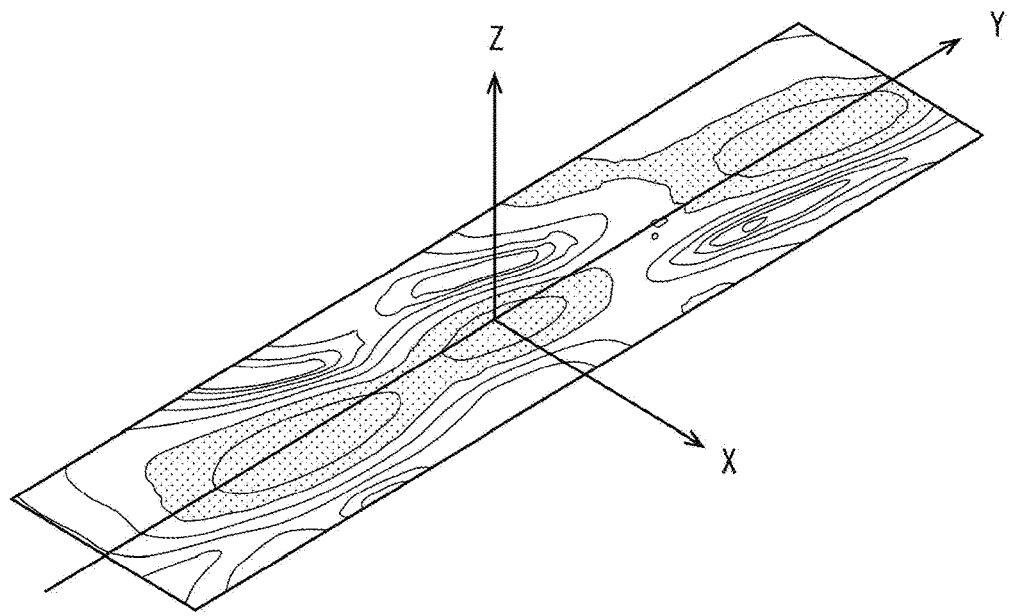
[FIG. 14]
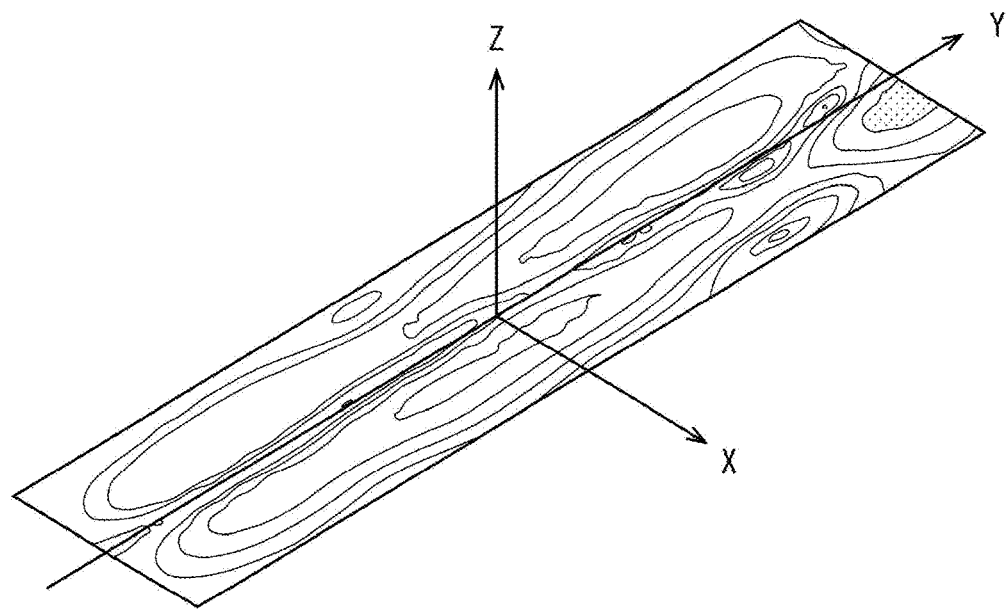

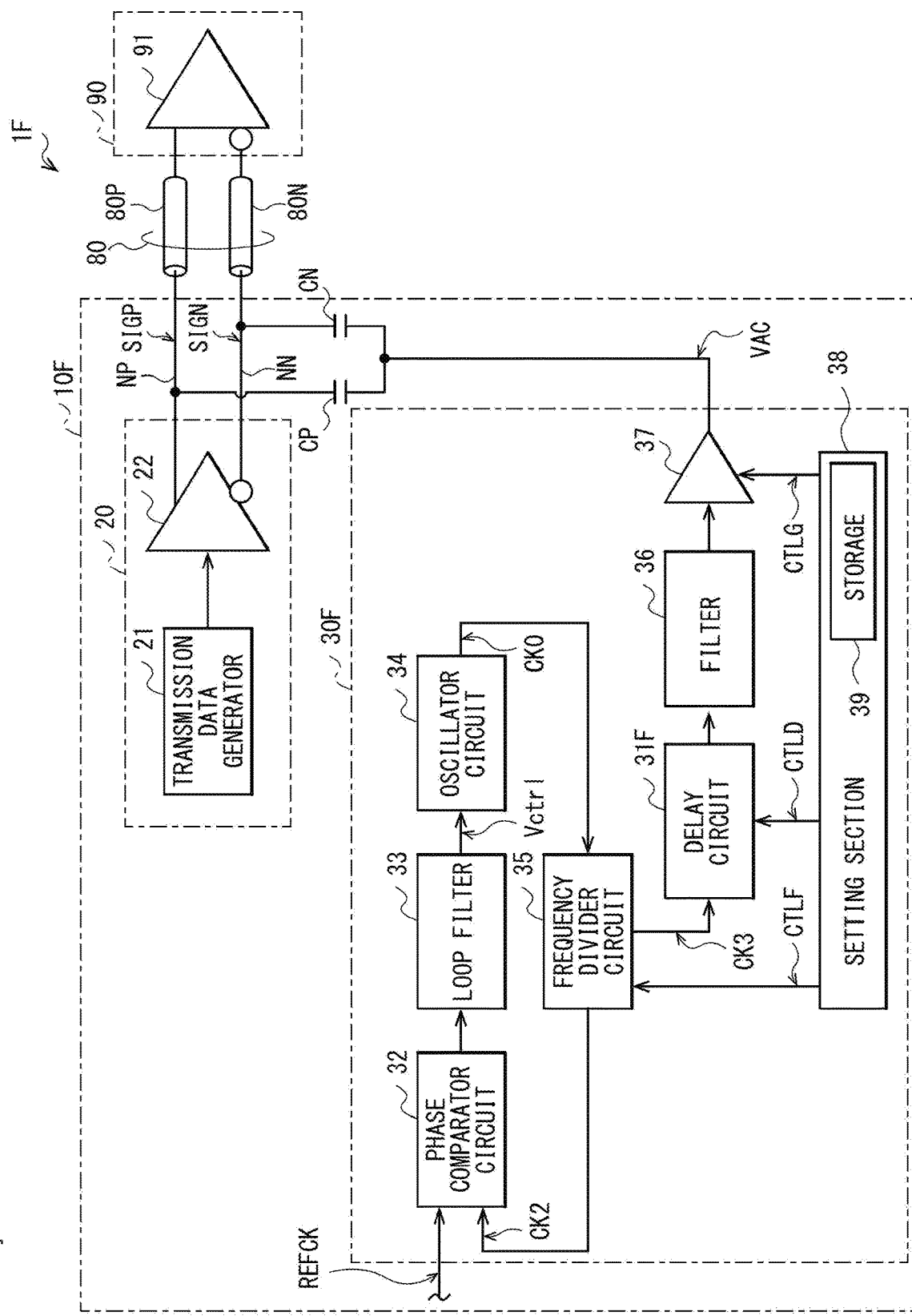
[FIG. 15]

[FIG. 16]
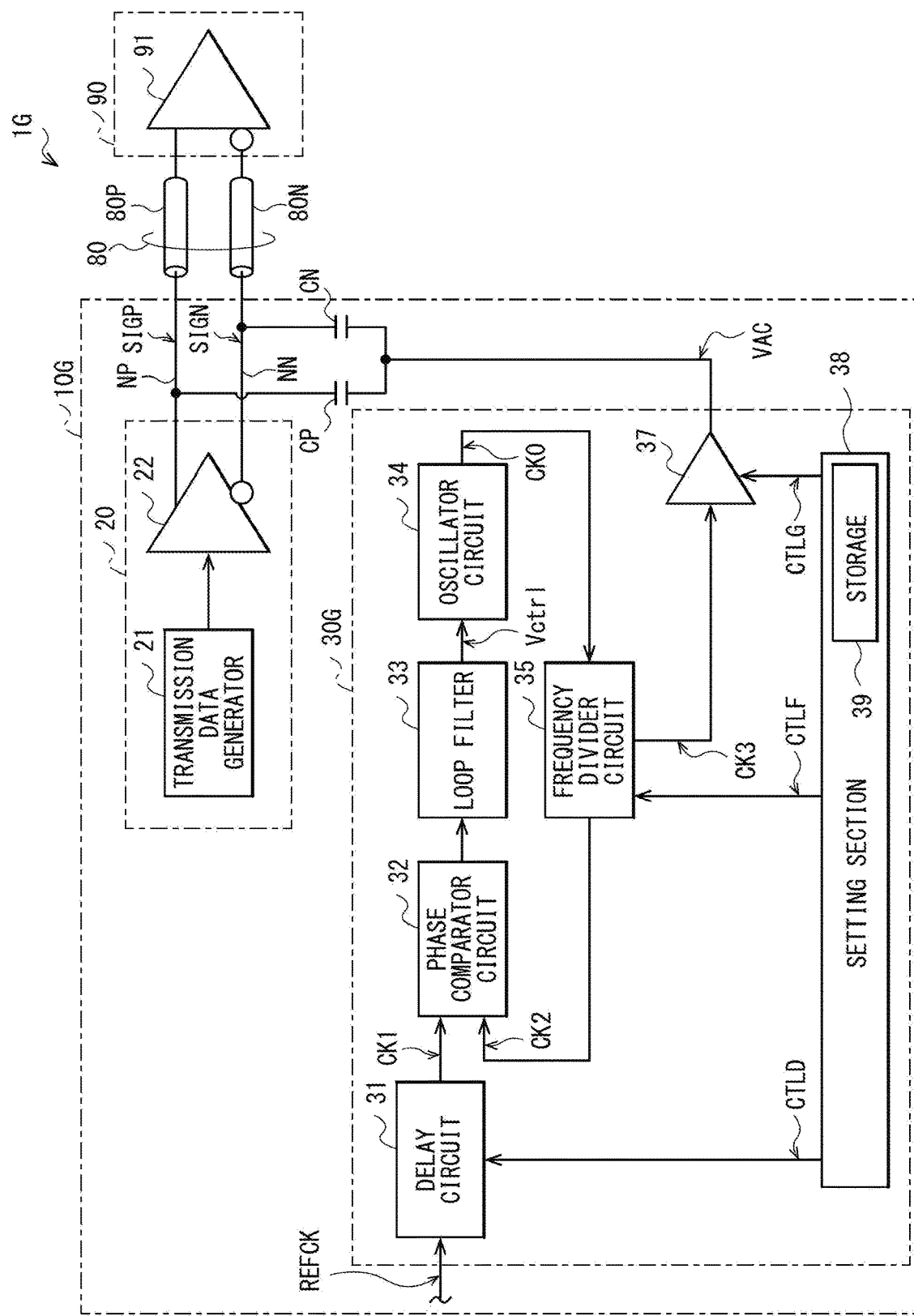

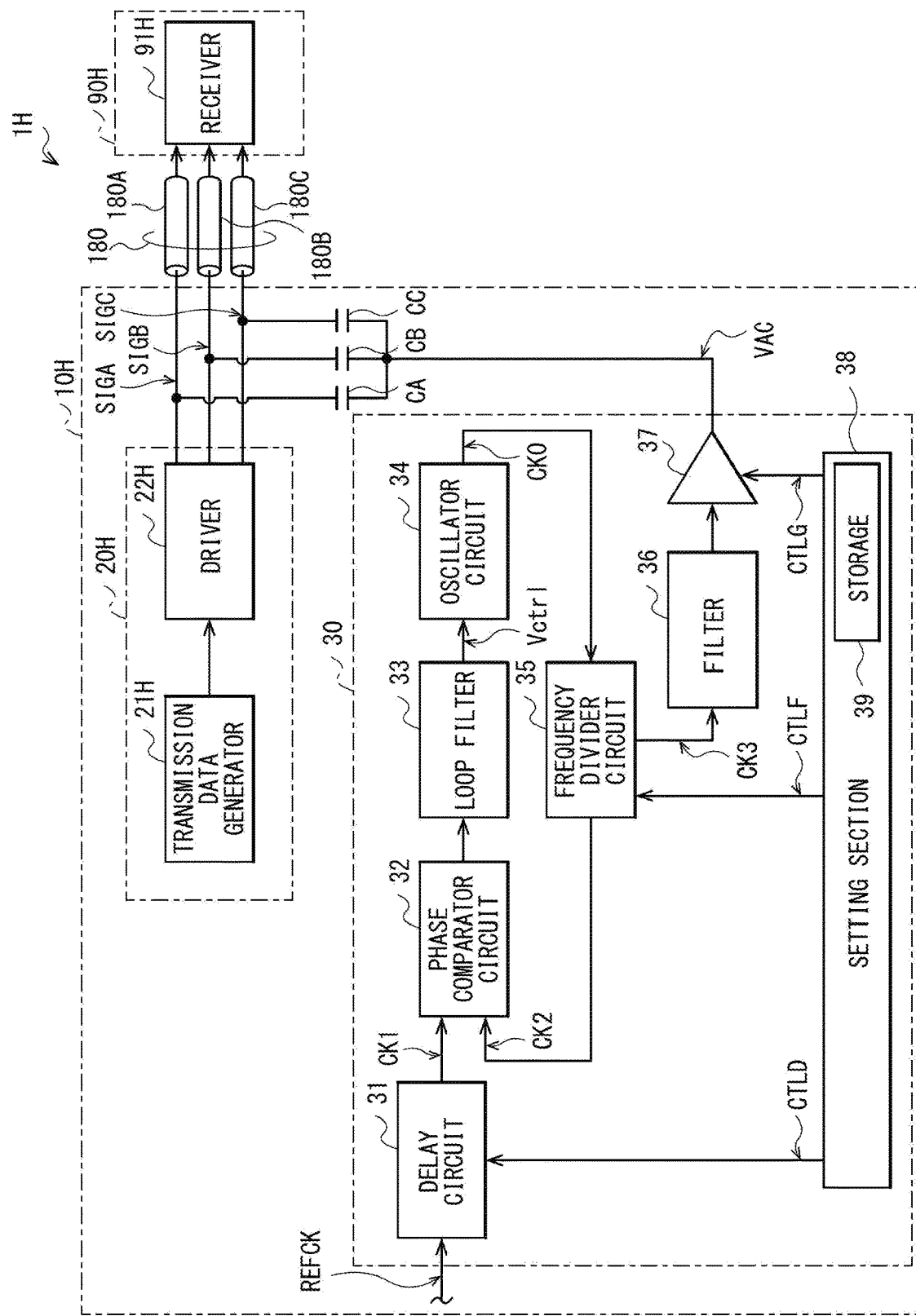
[FIG. 17]

[FIG. 18]
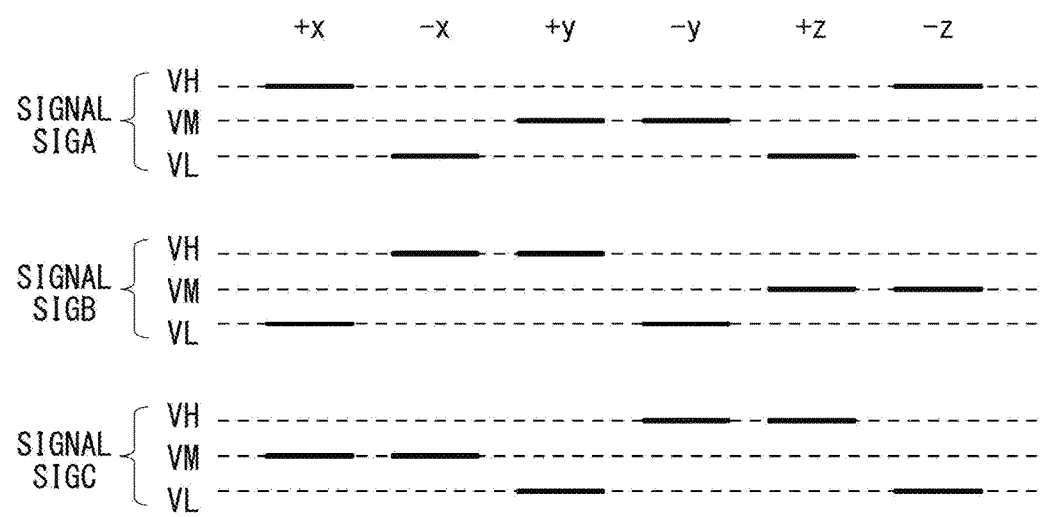

[FIG. 19]
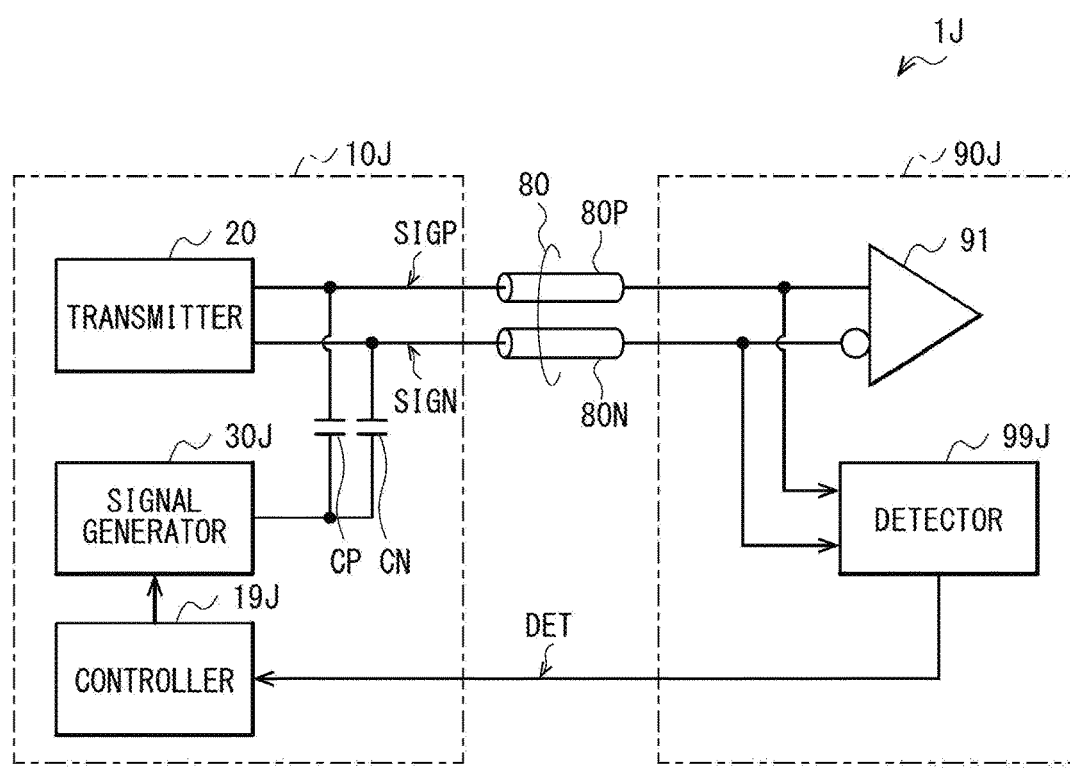

[FIG. 20]
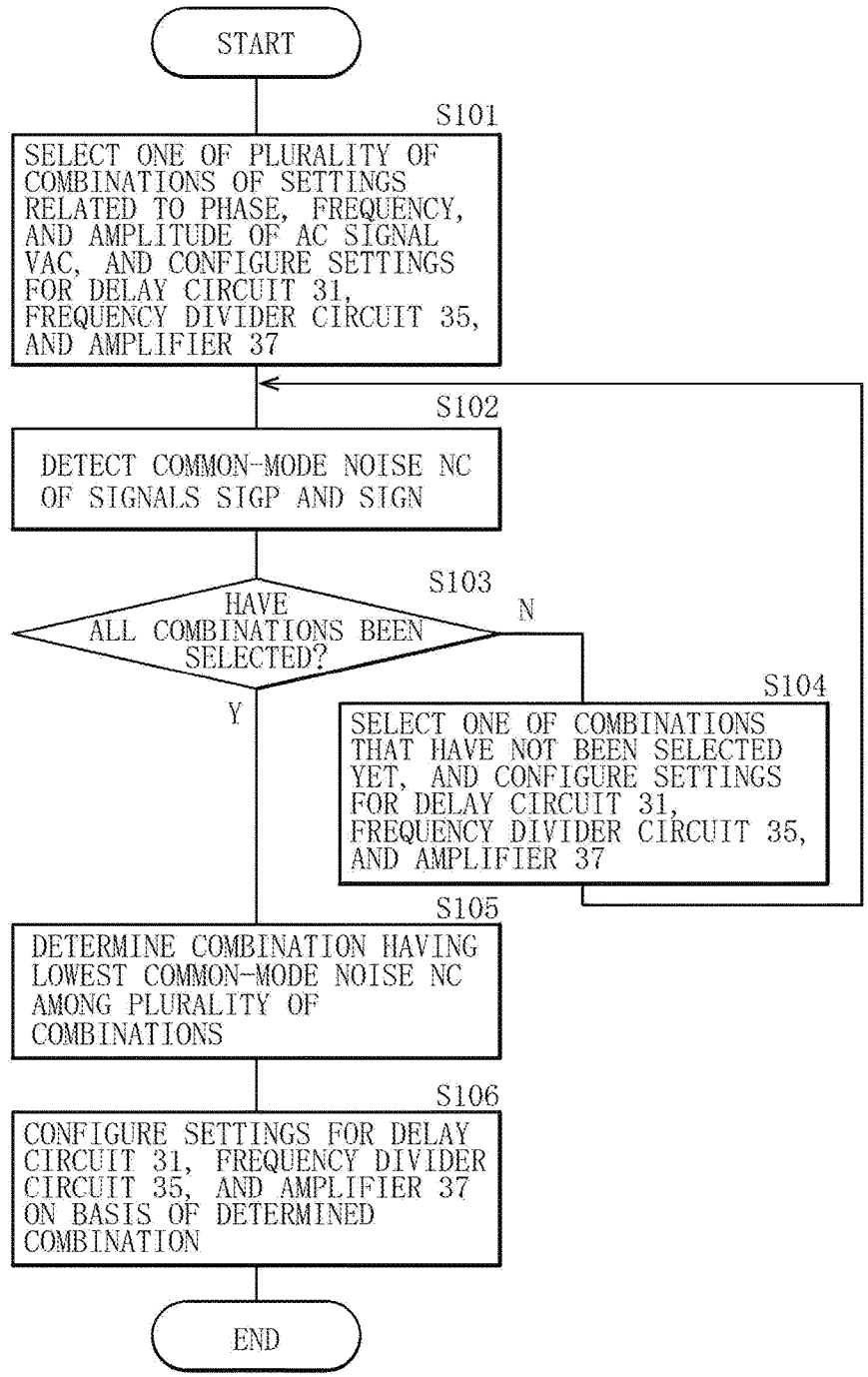

[FIG. 21]
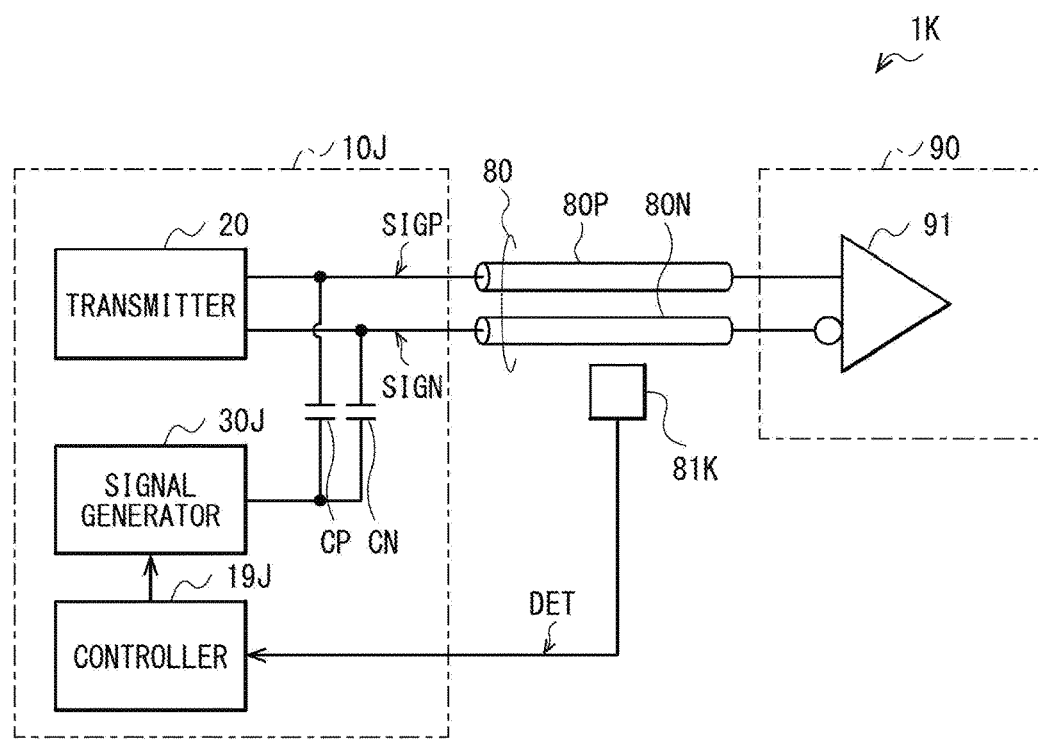

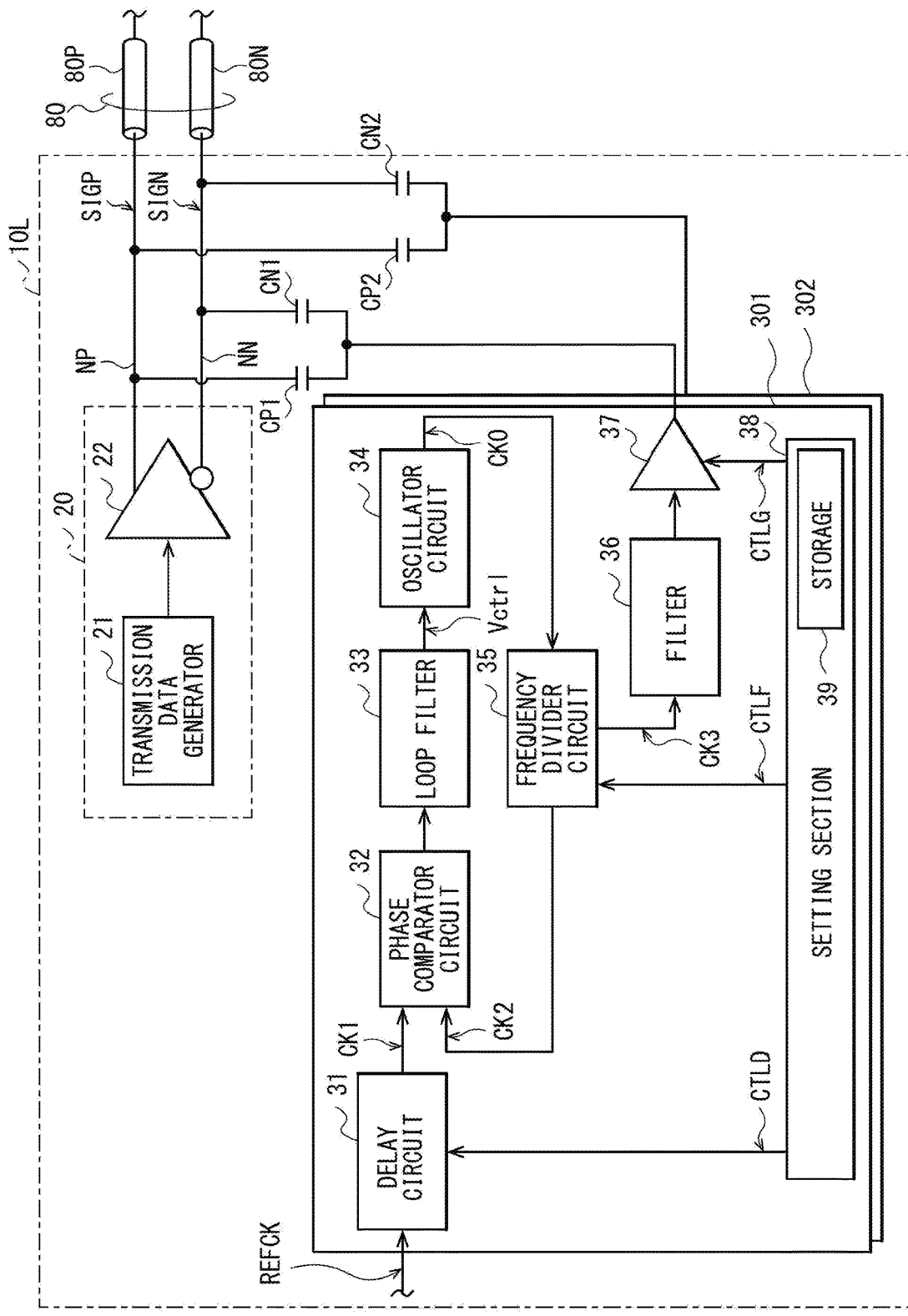
[FIG. 22]

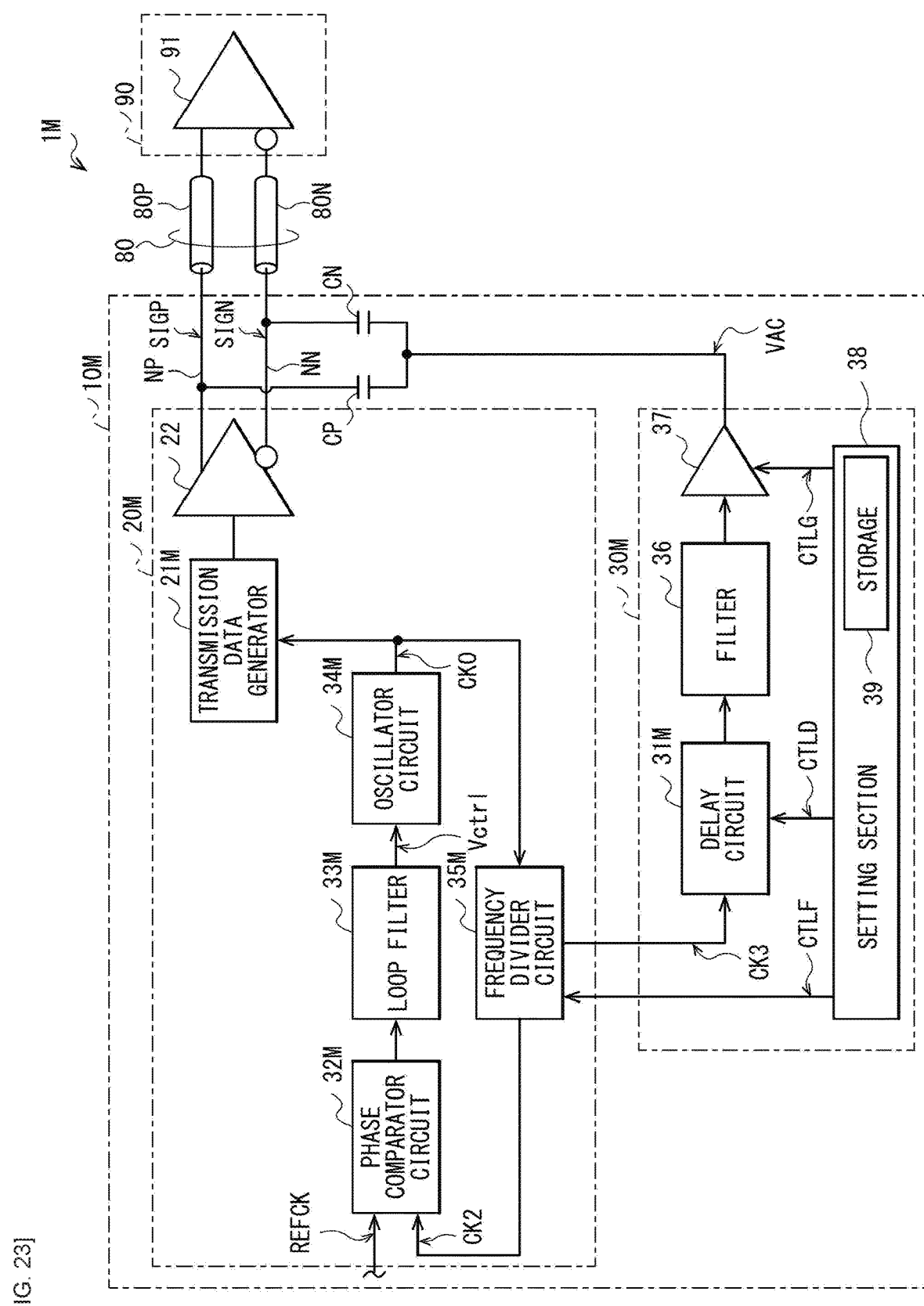
[FIG. 23]

TRANSMISSION DEVICE AND COMMUNICATION SYSTEM

CROSS REFERENCE TO RELATED APPLICATIONS

This application is a U.S. National Phase of International Patent Application No. PCT/JP2021/047981 filed on Dec. 23, 2021, which claims priority benefit of Japanese Patent Application No. JP 2021-013768 filed in the Japan Patent Office on Jan. 29, 2021. Each of the above-referenced applications is hereby incorporated herein by reference in its entirety.

TECHNICAL FIELD

The present disclosure relates to a communication system and a transmission device that transmit data.

BACKGROUND ART

A communication system transmits a symbol, for example, by using a plurality of signals. For example, PTL 1 discloses a communication system that performs communication by using a differential signal. This communication system makes it possible to adjust skew between two signals included in the differential signal.

CITATION LIST

Patent Literature

PTL 1: Japanese Unexamined Patent Application Publication No. H11-26593

SUMMARY OF THE INVENTION

Meanwhile, with regard to a communication system, it has been desired to reduce electromagnetic radiation caused by electromagnetic interference (EMI), and it has been expected to further reduce the electromagnetic radiation.

It is desirable to provide a communication system and a transmission device that make it possible to reduce electromagnetic radiation.

A transmission device according to an embodiment of the present technology includes: an alternating current (AC) signal generator, an AC signal generator; an amplifier; and a superimposer. The driver transmits a transmission signal including two or more signals. The AC signal generator includes a phase-locked loop circuit that generates an AC signal, the AC signal generator being configured to set a phase and frequency of the AC signal. The amplifier is configured to amplify the AC signal generated by the AC signal generator and set amplitude of the AC signal. The superimposer superimposes the AC signal amplified by the amplifier on the two or more signals.

A communication system according to an embodiment of the present technology includes: a transmission device; and a reception device. The transmission device transmits a transmission signal including two or more signals. The reception device receives the transmission signal. The transmission device includes a driver, an AC signal generator, an amplifier, and a superimposer. The driver transmits the transmission signal. The AC signal generator includes a phase-locked loop circuit that generates an AC signal, the AC signal generator being configured to set a phase and frequency of the AC signal. The amplifier is configured to amplify the AC signal generated by the AC signal generator and set amplitude of the AC signal. The superimposer superimposes the AC signal amplified by the amplifier on the two or more signals.

In the transmission device and the communication system according to the embodiment of the present technology, the phase-locked loop circuit in the AC signal generator generates the AC signal, and the phase and the frequency of the AC signal are set. The amplifier amplifies the AC signal generated by the AC signal generator and sets the amplitude of the AC signal. In addition, the superimposer superimposes the AC signal amplified by the amplifier on the two or more signals.

BRIEF DESCRIPTION OF THE DRAWINGS

FIG. 1 is a block diagram illustrating a configuration example of a communication system according to an embodiment of the present disclosure.

FIG. 2A is a circuit diagram illustrating a configuration example of a delay circuit illustrated in FIG. 1.

FIG. 2B is a circuit diagram illustrating another configuration example of the delay circuit illustrated in FIG. 1.

FIG. 3 is a block diagram illustrating a configuration example of a frequency divider circuit illustrated in FIG. 1.

FIG. 4A is an explanatory diagram illustrating an implementation example of a transmission device illustrated in FIG. 1.

FIG. 4B is an explanatory diagram illustrating another implementation example of the transmission device illustrated in FIG. 1.

FIG. 4C is an explanatory diagram illustrating another implementation example of the transmission device illustrated in FIG. 1.

FIG. 4D is an explanatory diagram illustrating another implementation example of the transmission device illustrated in FIG. 1.

FIG. 4E is an explanatory diagram illustrating another implementation example of the transmission device illustrated in FIG. 1.

FIG. 5 is an explanatory diagram illustrating a configuration example of a printed circuit board on which the transmission device illustrated in FIG. 1 is mounted.

FIG. 6 is an explanatory diagram illustrating an operation example of a driver 22 illustrated in FIG. 1.

FIG. 7 is an explanatory diagram illustrating an example of mode conversion from a differential mode to a common mode.

FIG. 8 is an explanatory diagram illustrating a principle of operation of the communication system illustrated in FIG. 1.

FIG. 9 is another explanatory diagram illustrating the principle of operation of the communication system illustrated in FIG. 1.

FIG. 10 is an explanatory diagram illustrating details of the principle of operation of the communication system illustrated in FIG. 1.

FIG. 11 illustrates an example of a wiring line pattern through which a simulation is performed.

FIG. 12 illustrates an example of circuits for the simulation.

FIG. 13 illustrates an example of a simulation result.

FIG. 14 illustrates another example of the simulation result.

FIG. 15 is a block diagram illustrating a configuration example of a communication system according to a modification.

FIG. 16 is a block diagram illustrating a configuration example of a communication system according to another modification.

FIG. 17 is a block diagram illustrating a configuration example of a communication system according to another modification.

FIG. 18 is an explanatory diagram illustrating an example of signals transmitted in the communication system illustrated in FIG. 17.

FIG. 19 is a block diagram illustrating a configuration example of a communication system according to another modification.

FIG. 20 is a flowchart illustrating an operation example of a communication system illustrated in FIG. 19.

FIG. 21 is a block diagram illustrating a configuration example of a communication system according to another modification.

FIG. 22 is a block diagram illustrating a configuration example of a communication system according to another modification.

FIG. 23 is a block diagram illustrating a configuration example of a communication system according to another modification.

MODES FOR CARRYING OUT THE INVENTION

Next, with reference to drawings, details of embodiments of the present disclosure will be described.

Embodiments

Configuration Example

FIG. 1 illustrates a configuration example of a communication system (communication system 1) according to an embodiment. The communication system 1 is configured to transmit data by using differential signals. It is to be noted that a transmission device according to the embodiment of the present disclosure is embodied by the present embodiment, and will also be described below. The communication system 1 includes a transmission device 10, a communication channel 80, and a reception device 90. The communication channel 80 includes lines 80P and 80N. In this example, the lines 80P and 80N have characteristic impedance of 50Ω. The communication system 1 is configured to transmit signals SIGP and SIGN via the communication channel 80. The signals SIGP and SIGN are the differential signals.

The transmission device 10 is configured to transmit the signals SIGP and SIGN to the reception device 90 via the communication channel 80. The transmission device 10 includes a transmitter 20, and a signal generator 30, capacitors CP and CN.

The transmitter 20 is configured to transmit the signals SIGP and SIGN. The transmitter 20 includes a transmission data generator 21 and a driver 22. The transmission data generator is configured to generate transmission data to be transmitted to the reception device 90. The driver 22 is a differential driver, and is configured to transmit the signals SIGP and SIGN on the basis of the transmission data generated by the transmission data generator 21. Specifically, the driver 22 transmits the signal SIGP to the reception device 90 via an output node NP and the line 80P, and transmits the signal SIGN to the reception device 90 via an output node NN and the line 80N. The driver 22 has output impedance of 100Ω in a differential mode. For example, the driver 22 has outputted impedance of 50Ω when viewed from the output node NP, and has outputted impedance of 50Ω when viewed from the output node NN.

The signal generator 30 is configured to generate an AC signal VAC on the basis of a reference clock signal REFCK. The signal generator 30 includes a delay circuit 31, a phase comparator circuit 32, a loop filter 33, an oscillator circuit 34, a frequency divider circuit 35, a filter 36, an amplifier 37, and a setting section 38.

The delay circuit 31 is configured to generate a clock signal CK1 by delaying the reference clock signal REFCK by an amount of delay corresponding to a control signal CTLD. The reference clock signal REFCK is a clock signal having a predetermined frequency. The delay circuit 31 makes it possible to adjust the amount of delay of the reference clock signal REFCK on the basis of the control signal CTLD.

FIG. 2A illustrates a configuration example of the delay circuit 31. The delay circuit 31 (delay circuit 31A) includes inverters IV1 to IV8, capacitors C1 to C8, and a selector SEL1.

Each of the inverters IV1 to IV8 is configured to invert an input signal and output the inverted signal. The inverters IV1 to IV8 are coupled in this order by multistage coupling. The inverter IV1, which is an inverter in a first stage, has an input terminal and an output terminal. The input terminal receives the reference clock signal REFCK, and the output terminal is coupled to one end of the capacitor C1 and an input terminal of the inverter IV2. The one end of the capacitor C1 is coupled to the output terminal of the inverter IV1 and an input terminal of the inverter IV2, and another end of the capacitor C11 is grounded. Such a configuration allows the inverter IV1 to delay the reference clock signal REFCK depending on charge and discharge time of the capacitor C1. The same applies to the inverters IV2 to IV8 and the capacitors C2 to C8.

The selector SEL1 is configured to select one signal from among an output signal of the inverter IV2, an output signal of the inverter IV4, an output signal of the inverter IV6, and an output signal of the inverter IV8, and output the selected signal as the clock signal CK1.

Such a configuration allows the selector SEL1 of the delay circuit 31A to select one signal from among the output signals of the inverters IV2, IV4, IV6, and IV8, and this makes it possible to adjust an amount of delay of the delay circuit 31A with respect to the reference clock signal REFCK. Specifically, for example, it is possible to shorten the amount of delay in a case where the selector SEL1 selects the output signal of the inverter IV2, or it is possible to extend the amount of delay in a case where the selector SEL1 selects the output signal of the inverter IV8.

It is to be noted that though the delay circuit 31A includes the inverters IV1 to IV8 at respective eight stages in this example, the present disclosure is not limited thereto. The delay circuit 31A may include the inverters IV at seven stages or less, or may include the inverters IV at nine stages or more. In addition, though the selector SEL1 is configured to select one of the four signals in this example, the present disclosure is not limited thereto. For example, the selector SEL1 may select one of three signals or less, or may select one of five signals or more.

FIG. 2B illustrates another configuration example of the delay circuit 31. The delay circuit 31 (delay circuit 31B) includes inverters IV11, IV12, IV21 to IV24, transistors MN1 to MN4, MP1 to MP4, capacitors C11 to C14, and a decoder DEC1. The transistors MN1 to MN4 are n-type metal-oxide-semiconductor (MOS) transistors, and the transistors MP1 to MP4 are p-type MOS transistors.

The inverter IV11 has an input terminal and an output terminal. The input terminal receives the reference clock signal REFCK, and the output terminal is coupled to drains of the transistors MN1 to MN4, sources of the transistors MP1 to MP4, and an input terminal of the inverter IV12.

The drain of the transistor MN1 is coupled to the output terminal of the inverter IV11, the drains of the transistors MN2 to MN4, the sources of the transistors MP1 to MP4, and the input terminal of the inverter IV12. The gate of the transistor MN1 receives a control signal CTLD1 from the decoder DEC1. The source of the transistor MN1 is coupled to the drain of the transistor MP1 and one end of the capacitor C11. The source of the transistor MP1 is coupled to the output terminal of the inverter IV11, the drains of the transistors MN1 to MN4, the sources of the transistors MP2 to MP3, and the input terminal of the inverter IV12. The gate of the transistor MP1 is coupled to the output terminal of the inverter IV21. The drain of the transistor MP1 is coupled to the source of the transistor MN1 and the one end of the capacitor C11. The transistors MN1 and MP1 are included in a so-called transmission gate. The one end of the capacitor C11 is coupled to the source of the transistor MN1 and the drain of the transistor MP1, and another end of the capacitor C1 is grounded. The input terminal of the inverter IV21 receives the control signal CTLD1 from the decoder DEC1, and the output terminal of the inverter IV21 is coupled to the gate of the transistor MP1. Such a configuration turns both the transistors MN1 and MP1 into an ON state and couples the capacitor C11 to the output terminal of the inverter IV11 in a case where the control signal CTLD1 is at a high level, for example. Alternatively, for example, in a case where the control signal CTLD1 is at a low level, such a configuration turns both the transistors MN1 and MP1 into an OFF state and disconnects the capacitor C11 from the output terminal of the inverter IV11. The same applies to a set of the transistors MN2, MP2, the capacitor C12, and the inverter IV22, a set of the transistors MN3, MP3, the capacitor C13, and the inverter IV23, and a set of the transistors MN4, MP4, the capacitor C14, and the inverter IV24.

The input terminal of the inverter IV21 is coupled to the output terminal of the inverter IV11, the drains of the transistors MN1 to MN4, and the sources of the transistors MP1 to MP4. The output terminal of the inverter IV12 outputs the clock signal CK1.

The decoder DEC1 is configured to generate control signals CTLD1 to CTLD4 on the basis of the control signal CTLD.

Such a configuration allows the delay circuit 31B to change the number of capacitors to be coupled to the output terminal of the inverter IV11 out of the capacitors C11 to C14, and this makes it possible to change an amount of delay of the delay circuit 31B with respect to the reference clock signal REFCK. For example, it is possible to shorten the amount of delay in a case where the number of capacitors coupled to the output terminal of the inverter IV11 is small, or it is possible to extend the amount of delay in a case where the number of capacitors coupled to the output terminal of the inverter IV11 is large.

It is to be noted that though the delay circuit 31B includes the four capacitors C11 to C14 in this example, the present disclosure is not limited thereto. The delay circuit 31B may include three capacitors or less, or may include five capacitors or more.

The phase comparator circuit 32 (FIG. 1) is configured to compare a phase of the clock signal CK1 generated by the delay circuit 31 with a phase of a clock signal CK2 generated by the frequency divider circuit 35, and output a result of the comparison.

The loop filter 33 is configured to generate control voltage Vctrl on the basis of the result of comparison made by the phase comparator circuit 32.

The oscillator circuit 34 is a voltage-controlled oscillator (VCO), and is configured to generate a clock signal CK0 having a frequency corresponding to the control voltage Vctrl on the basis of the control voltage Vctrl.

The frequency divider circuit 35 is configured to perform a frequency dividing operation at a predetermined frequency division ratio on the basis of the clock signal CK0, and generate the clock signal CK2. In addition, the frequency divider circuit 35 is also configured to perform an operation of outputting a clock signal CK3 that is frequency-divided at a frequency division ratio corresponding to a control signal CTLF, on the basis of the control signal CTLF.

FIG. 3 illustrates a configuration example of the frequency divider circuit 35. The frequency divider circuit 35 includes a frequency divider circuit DIV1 and a selector SEL2.

The frequency divider circuit DIV1 is configured to perform a frequency dividing operation at a predetermined frequency division ratio on the basis of the clock signal CK0, and generate the clock signal CK2. The clock signal CK2 has a frequency that is 1/N (N is a natural number) of a frequency of the clock signal CK0. The frequency divider circuit DIV1 is also configured to perform the frequency dividing operation at various frequency division ratios on the basis of the clock signal CK0, and generate a plurality of clock signals CKDIV having different frequencies from each other. The plurality of clock signals CKDIV includes a clock signal having a frequency that is 1/K (K is a natural number) of the frequency of the clock signal CK0. Specifically, for example, the plurality of clock signals CKDIV includes a clock signal having a frequency that is ½ of the frequency of the clock signal CK0, a clock signal having a frequency that is ⅓ of the frequency of the clock signal CK0, . . . , a clock signal having a frequency that is 1/(N−1) of the frequency of the clock signal CK0, a clock signal having a frequency that is 1/N of the frequency of the clock signal CK0, and the like. It is to be noted that though "N" and "K" are supposed to be natural numbers in the above example, the present disclosure is not limited thereto. For example, "N" and "K" may be decimals that are greater than 1.

The selector SEL2 is configured to select one clock signal from among the plurality of clock signals CKDI on the basis of the control signal CTLF, and output the selected clock signal as the clock signal CK3.

Such a configuration allows the selector SEL2 of the frequency divider circuit 35 to select one of a plurality of clock signals CKDIV, and this makes it possible to change the frequency of the clock signal CK3.

The filter 36 (FIG. 1) is a low-pass filter and is configured to reduce a harmonic component included in the clock signal CK3.

The amplifier 37 is configured to amplify a signal supplied from the filter 36 by gain corresponding to a control signal CTLG and generate the AC signal VAC. The amplifier 37 makes it possible to adjust amplitude of the AC signal VAC by adjusting the gain on the basis of the control signal CTLG. Output impedance of the amplifier 37 is set to a value that has less impact on output impedance of the transmission device 10.

The phase comparator circuit 32, the loop filter 33, the oscillator circuit 34, and the frequency divider circuit 35 are included in a phase-locked loop circuit. The clock signal CK2 synchronizes with the clock signal CK1 when the phase-locked loop circuit performs a phase synchronization operation. This allows the clock signal CK2 to have a phase corresponding to the phase of the clock signal CK1, and allows the clock signal CK2 to have a frequency that is same as the frequency of the clock signal CK1. Therefore, when the delay circuit 31 changes the amount of delay on the basis of the control signal CTLD, the phase of the clock signal CK3 changes and the phase of the AC signal VAC also changes. In addition, when the frequency divider circuit 35 outputs the clock signal CK3 that is frequency-divided at the frequency division ratio corresponding to a control signal CTLF, the frequency of the clock signal CK3 changes and the frequency of the AC signal VAC also changes. In such a way, the phase of the AC signal VAC is adjusted on the basis of the control signal CTLD, and the phase of the AC signal VAC is adjusted on the basis of the control signal CTLF.

The setting section 38 is configured to set the phase, frequency, and amplitude of the AC signal VAC. The setting section 38 includes a storage 39. The storage 39 is a nonvolatile memory, and is configured to store setting data of the amount of delay in the delay circuit 31, setting data of the frequency in the frequency divider circuit 35, and setting data of the gain in the amplifier 37. The setting section 38 generates the control signals CTLD, CTLF, and CTLG on the basis of the information stored in the storage 39, supplies the control signal CTLD to the delay circuit 31, supplies the control signal CTLF to the frequency divider circuit 35, and supplies the control signal CTLG to the amplifier 37. In this way, the setting section 38 makes it possible to set the phase, frequency, and amplitude of the AC signal VAC.

Such a configuration allows the signal generator 30 to generate the AC signal VAC that has the phase, frequency, and amplitude corresponding to the setting information stored in the storage 39.

One end of the capacitor CP (FIG. 1) is coupled to the output node NP, and another end of the capacitor CP is coupled to an output terminal of the amplifier 37. One end of the capacitor CN is coupled to the output node NN, and another end of the capacitor CN is coupled to the output terminal of the amplifier 37. Such a configuration allows the capacitors CP and CN to superimpose the AC signal VAC generated by the signal generator 30 on the signals SIGP and SIGN, respectively. A capacitance value of the capacitor CP and a capacitance value of the capacitor CN are set to a same value. The capacitance values of the capacitors CP and CN are set to a value that has less impact on output impedance of the transmission device 10.

The reception device 90 is configured to receive the signals SIGP and SIGN that are transmitted from the transmission device 10 via the communication channel 80. The reception device 90 includes a receiver 91. The receiver 91 is a differential receiver and is configured to receive the signals SIGP and SIGN. The receiver 91 has input impedance of 100Ω in a differential mode.

Such a configuration allows the signal generator 30 in the transmission device 10 to generate the AC signal VAC, and allows the capacitors CP and CN to superimpose the AC signal VAC on the signals SIGP and SING to be transmitted from the transmitter 20. As described later, this allows the communication system 1 to suppress common-mode noise included in the signals SIGP and SING, and to reduce electromagnetic radiation.

FIGS. 4A, 4B, 4C, 4D, and 4E illustrate implementation examples of the transmission device 10. As described below, it is possible to implement the transmission device 10 in various ways.

For example, in a case of a transmission device 10 (transmission device 10A) illustrated in FIG. 4A, the transmitter 20, the signal generator 30, and the capacitors CP and CN may be disposed on a single semiconductor chip 100A.

Alternatively, for example, in a case of a transmission device (transmission device 10B) illustrated in FIG. 4B, the transmitter 20 and the signal generator 30 may be disposed on a semiconductor chip 100B, and the capacitors CP and CN may be disposed separately from the semiconductor chip 100B. In this case, for example, it is possible to use a so-called chip capacitor for the capacitors CP and CN. In this example, the signal generator 30 is coupled to the capacitors CP and CN via two respective terminals T of the semiconductor chip 100B. It is to be noted that the present disclosure is not limited thereto. For example, in a case of a transmission device 10 (transmission device 10C) illustrated in FIG. 4C, the signal generator 30 may be coupled to the capacitors CP and CN via a single terminal T of a semiconductor chip 100C.

Alternatively, for example, in a case of a transmission device 10 (transmission device 10D) illustrated in FIG. 4D, the transmitter 20 may be disposed on a semiconductor chip 100D1, the signal generator 30 may be disposed on a semiconductor chip 100D2, and the capacitors CP and CN may be disposed separately from the semiconductor chips 100D1 and 100D2. In this example, the signal generator 30 is coupled to the capacitors CP and CN via two respective terminals T of the semiconductor chip 100D2. It is to be noted that the present disclosure is not limited thereto. For example, in a case of a transmission device 10 (transmission device 10E) illustrated in FIG. 4E, the signal generator 30 may be coupled to the capacitors CP and CN via a single terminal T of a semiconductor chip 100E2.

Here, the driver 22 corresponds to a specific example of a "driver" according to the present disclosure. The delay circuit 31, the phase comparator circuit 32, the loop filter 33, the oscillator circuit 34, the frequency divider circuit 35, and the filter 36 correspond to a specific example of an "alternating current signal generator" according to the present disclosure. The amplifier 37 corresponds to a specific example of an "amplifier" according to the present disclosure. The capacitors CP and CN correspond to a specific example of a "superimposer" according to the present disclosure. The storage 39 corresponds to a specific example of a "storage" according to the present disclosure. The clock signal CK1 corresponds to a specific example of a "first clock signal" according to the present disclosure. The clock signal CK2 corresponds to a specific example of a "second clock signal" according to the present disclosure. The phase comparator circuit 32 corresponds to a specific example of a "phase comparator circuit" according to the present disclosure. The loop filter 33 corresponds to a specific example of a "loop filter" according to the present disclosure. The oscillator circuit 34 corresponds to a specific example of an "oscillator circuit" according to the present disclosure. The frequency divider circuit 35 corresponds to a specific example of a "frequency divider circuit" according to the present disclosure. The plurality of clock signals CKDIV corresponds to a specific example of a "plurality of alternating current signals" according to the present disclosure. The signals SIGP and SIGN correspond to a specific example of a "transmission signal" according to the present disclosure. The output node NP corresponds to a specific example of a "first node" according to the present disclosure. The output node NN corresponds to a specific example of a "second node" according to the present disclosure. The capacitor CP corresponds to a specific example of a "first capacitor" according to the present disclosure. The capacitor CN corresponds to a specific example of a "second capacitor" according to the present disclosure.

[Operations and Actions]

Next, operations and actions of the communication system 1 according to the present embodiment will be described.

(Overview of Overall Operation)

First, with reference to FIG. 1, an overview of overall operation of the communication system 1 will be described. The transmission data generator 21 of the transmitter 20 generates transmission data to be transmitted to the reception device 90. The driver 22 transmits the signals SIGP and SIGN on the basis of the transmission data generated by the transmission data generator 21. The delay circuit 31 of the signal generator 30 generates the clock signal CK1 by delaying the reference clock signal REFCK by an amount of delay corresponding to the control signal CTLP. The phase comparator circuit 32 compares the phase of the clock signal CK1 generated by the delay circuit 31 with the phase of the clock signal CK2 generated by the frequency divider circuit 35, and outputs a result of the comparison. The loop filter 33 generates the control voltage Vctrl on the basis of the result of comparison made by the phase comparator circuit 32. The oscillator circuit 34 generates the clock signal CK0 having a frequency corresponding to the control voltage Vctrl on the basis of the control voltage Vctrl. The frequency divider circuit 35 performs a frequency dividing operation at a predetermined frequency division ratio on the basis of the clock signal CK0, and generates the clock signal CK2. In addition, the frequency divider circuit 35 also outputs the clock signal CK3 that is frequency-divided at a frequency division ratio corresponding to the control signal CTLF, on the basis of the control signal CTLF. The filter 36 reduces a harmonic component included in the clock signal CK3. The amplifier 37 amplifies a signal supplied from the filter 36 by gain corresponding to a control signal CTLG and generates the AC signal VAC. The setting section 38 sets the phase, frequency, and amplitude of the AC signal VAC by generating the control signals CTLP, CTLF, and CTLG. The capacitors CP and CN superimpose the AC signal VAC generated by the signal generator 30 on the signals SIGP and SIGN, respectively.

(Detailed Operation)

In general, the differential signal is less likely to emit the electromagnetic radiation than a single-phase signal. However, the differential signal emits the electromagnetic radiation if the differential signal causes the common-mode noise. Hereinafter, examples in which the differential signal causes the common-mode noise will be described.

FIG. 5 illustrates an example of a printed circuit board (PCB) on which the transmission device 10 is mounted. A package 110 containing a semiconductor chip 100 and a connector 121 are mounted on the printed circuit board (printed circuit board 120). In addition, PCB wiring lines W2 that couples two terminals of the package 110 to the connector 121 are formed on the printed circuit board 120. The driver 22 of the semiconductor chip 100 is coupled to the connector 121 via pads 101 of the semiconductor chip 100, package wiring lines W1 of the package 110, and the PCB wiring lines W2 of the printed circuit board 120. In this example, the package wiring line W1 includes a bonding wire 111 and an inner lead 112.

For example, the differential signal may cause the common-mode noise in a case where a waveform of the signal SIGP generated by the driver 22 and a waveform of the signal SIGN generated by the driver 22 do not form a symmetrical shape.

FIG. 6 illustrates an example of the waveforms of the signals SIGP and SIGN. FIG. 6(A) illustrates a case where the waveform of the signal SIGP and the waveform of the signal SIGN form a symmetrical shape. FIG. 6(B) illustrates a case where the waveform of the signal SIGP and the waveform of the signal SIGN do not form a symmetrical shape.

In the example illustrated in FIG. 6(A), a falling timing of the signal SIGP is identical to a rising timing of the signal SIGN. In addition, a rising time tR is same as a falling time tF. A common-mode signal VCOM is an average voltage between the voltage of the signal SIGP and the voltage of the signal SIGN, and the common-mode signal VCOM is an approximately constant voltage level. In other words, the signal SIGP and the signal SIGN causes no common-mode noise NC in such a case.

On the other hand, for example, as illustrated in FIG. 6(B), the signal SIGP and the signal SIGN may cause the common-mode noise NC in a case where a waveform of the signal SIGP and a waveform of the signal SIGN do not form a symmetrical shape. In this example, there is skew between the signal SIGP and the signal SIGN, and a falling timing of the signal SIGP is at a remove from a rising timing of the signal SIGN. In this case, a common-mode signal VCOM fluctuates depending on a difference between a transition timing of the signal SIGP and a transition timing of the signal SIGN, and this causes the common-mode noise NC.

As described above, the signal SIGP and the signal SIGN may cause the common-mode noise NC in a case where a waveform of the signal SIGP generated by the driver 22 and a waveform of the signal SIGN generated by the driver 22 do not form a symmetrical shape.

Alternatively, if mode conversion from a differential mode to a common mode happens in wiring lines for communicating the signals SIGP and SIGN, this may cause the common-mode noise NC. For example, in FIG. 5, the two wiring lines of the package wiring lines W1 desirably form a symmetrical shape. In a similar way, the two wiring lines of the PCB wiring lines W2 desirably form a symmetrical shape. However, the mode conversion from the differential mode to the common mode may happen in a case where the two wiring lines do not form the symmetrical shape. Even if the two wiring lines are designed to form a symmetrical shape, sometimes their symmetry may deteriorate due to manufacturing tolerances. Accordingly, in this case, the mode conversion from the differential mode to the common mode may happen.

FIG. 7 illustrates an example of a parameter Scd21 that is a mixed-mode S-parameter indicating degrees of the mode conversion. The parameter Scd21 indicates percentages of conversion from a difference-mode signal to a common-mode signal. For example, in the example illustrated in FIG. 5, the two pads 101 are on a primary side and the connector 121 is on a secondary side. In this case, the mixed-mode S-parameter Scd21 indicates percentages of conversion of a difference between the signal SIGP generated by the driver 22 and the signal SIGN generated by the driver 22 to a common-mode signal Vcom via the package wiring lines W1 and the PCB wiring lines W2.

In general, as illustrated in FIG. 7, the value of the parameter Scd21 increases as the frequency gets higher. In this example, the value of the parameter Scd21 is "−20 dB"

at 2 GHz, for example. In this case, the common-mode signal Vcom has an amplitude of 100 mV on the secondary side in a case where the differential signal has an amplitude of 1 V on the primary side at a frequency of 2 GHz, for example. In other words, the mode conversion from the differential mode to the common mode causes the common-mode noise NC.

In a case where there is skew between the signal SIGP and the signal SIGN as illustrated in FIG. 6, for example, it is possible to reduce the skew by using the technology disclosed in PTL 1 and reduce the common-mode noise NC. Even in a case where symmetry of the waveform of the signal SIGP and the waveform of the signal SIGN improves in such a way but the wiring lines for communicating the signals SIGP and SIGN do not form a symmetrical shape, the mode conversion causes the common-mode noise NC as illustrated in FIG. 7. As described above, the electromagnetic radiation is emitted in a case where the mode conversion causes the common-mode noise.

In such a case, in general, methods of reducing the common-mode noise NC may include a method of making wiring lines for communicating the signals SIGP and SIGN form a symmetrical shape and a method of making amplitude of a differential signal smaller. However, sometimes it may be difficult to employ the method of making wiring lines form a symmetrical shape due to physical restriction of wiring line disposition. If using the method of making amplitude of a differential signal smaller, the amplitude of the differential signal that should be communicated deteriorates, and there are limitations to an amount of reduction in the common-mode noise NC in terms of S/N ratio.

Therefore, the communication system 1 according to the present embodiment reduces the common-mode noise NC by superimposing the AC signal VAC on the signals SIGP and SIGN.

FIG. 8 and FIG. 9 schematically illustrate the method of reducing the common-mode noise NC in the communication system 1. (A) indicates an example of waveforms in time domain. (B) indicates spectra in frequency domain.

For example, as illustrated in FIG. 8, in the case where the common-mode noise NC (common-mode noise NC1) is caused, the communication system 1 superimposes an AC signal (AC signal VAC2) on the common-mode noise NC1, the AC signal (AC signal VAC2) having a frequency that is same as the frequency of the common-mode noise NC1, having an amplitude that is same as the amplitude of the common-mode noise NC1, and having a phase that is 180 degrees out of phase with the common-mode noise NC1. This allows the communication system 1 to cancel the common-mode noise NC1 and reduce noise in the common-mode signal VCOM.

For example, in the example illustrated in FIG. 9, common-mode noises NC having various frequencies are caused. For example, the communication system 1 makes it possible to reduce one of the common-mode noises NC having various frequencies. For example, in a case of reducing a common-mode noise NC at 2.4 GHz, the communication system 1 makes it possible to reduce the common-mode noise NC at 2.4 GHz by superimposing the AC signal making it possible to cancel the common-mode noise NC as illustrated in FIG. 8.

Specifically, for example, in a case where the common-mode noise NC has an amplitude of 0.5 V at 2.4 GHz, it is possible to reduce the common-mode noise NC at 2.4 GHz by superimposing an AC signal having a frequency of 2.4 GHz, having an amplitude of 0.5 V, and having a phase that is 180 degrees out of phase with the phase of a 2.4 GHz component of the common-mode noise NC.

The above-described mode conversion from the differential mode to the common mode is likely to happen inside the package 110 illustrated in FIG. 5. One reason for this is that, in recent years, packages of semiconductor chips have undergone progressive miniaturization, and many wiring lines are disposed in a small area. Therefore, it is highly possible to deteriorate symmetry of wiring lines due to physical restriction. Specifically, for example, in a case where two wiring lines for communicating the differential signals have different lengths from each other, this deteriorates symmetry of the two wiring lines. The symmetry of the two wiring lines also deteriorates in a case where the two wiring lines have different parasitic capacitances. In other words, since the parasitic capacitance exists between adjacent wiring lines, the two wiring lines for communicating differential signals may have different parasitic capacitances. In this case, the symmetry of the two wiring lines deteriorates, and the mode conversion from the differential mode to the common mode happens. As described above, the mode conversion from the differential mode to the common mode is likely to happen in the package wiring lines W1 illustrated in FIG. 5. Therefore, for example, it is effective to reduce the common-mode noise NC caused by the mode conversion, near coupling points between the package wiring lines W1 and the PCG wiring lines W2.

FIG. 10 illustrates the method of reducing the common-mode noise NC in the communication system 1 more specifically. For example, the signal generator 30 causes the output node of the driver 22 to superimpose an AC signal (AC signal VAC1) in a case where the driver 22 transmits the signals SIGP and SIGN and the common-mode noise NC (common-mode noise NC1) is caused near the coupling points between the package wiring lines W1 and the PCG wiring lines W2 due to the mode conversion from the differential mode to the common mode. This makes it possible to cancel the common-mode noise NC1 by the AC signal (AC signal VAC2) corresponding to the AC signal VAC1 near the coupling points between the package wiring lines W1 and the PCG wiring lines W2. The communication system 1 makes it possible to reduce the common-mode noise NC in the above-described way.

(Simulation)

Next, a three-dimensional electromagnetic field simulation done for examining the effect of the method of reducing the common-mode noise NC in the communication system 1 will be described.

FIG. 11 illustrates an example of a wiring line pattern PAT used for the electromagnetic field simulation. The wiring line pattern AT includes wiring line patterns PAT1 and PAT2. The wiring line pattern PAT corresponds to the package wiring lines W1 and the PCB wiring lines W2 illustrated in FIG. 5. Specifically, the wiring line pattern PAT1 corresponds to the package wiring lines W1 illustrated in FIG. 5, the wiring line pattern PAT2 corresponds to the PCB wiring lines W2 illustrated in FIG. 5, input ends E1 of the wiring line pattern PAT correspond to the positions of the pads 101 illustrated in FIG. 5, points A, which are coupling points between the wiring line pattern PAT1 and the wiring line pattern PAT2, correspond to the positions of the coupling points between the package wiring lines W1 and the PCB wiring lines W2 illustrated in FIG. 5, and output ends E2 of the wiring line pattern PAT correspond to the position of the connector 121. In the wiring line pattern PAT1, a portion of the wiring line detours and the wiring lines do not form a symmetrical shape. This makes it easier to cause the mode conversion. In the wiring line pattern PAT2, the two wiring lines form a symmetrical shape, and this makes it difficult to cause the mode conversion. In this example, the wiring lines in the wiring line pattern PAT2 have a longer length than the wiring lines in the wiring line pattern PAT1. In the wiring line pattern PAT, the wiring lines other than the detour wiring line have characteristic impedance of 100Ω in the differential mode.

A simulation has been done at an operating frequency of 4.5 GHz by using the wiring line pattern PAT. In this simulation, a mixed-mode S-parameter from the input ends E1 to the points A is found. The parameter Scd21 is "−23 dB" at 4.5 GHz. Accordingly, it is confirmed that the mode conversion from the differential mode to the common mode happens due to the wiring line pattern PAT1.

Next, a simulation in which signals are applied to the wiring line pattern PAT to check an amount of electromagnetic radiation has been done.

FIG. 12 illustrates an example of circuits for the simulation. The respective circuits are coupled to the input ends E1 and the output ends E2 of the wiring line pattern PAT.

A circuit coupled to the input ends E1 of the wiring line pattern PAT includes an AC signal source AC1, resistors R1P and R1N, an AC signal source AC2, and capacitors C1P and C1N. This circuit corresponds to the transmission device 10 illustrated in FIG. 1. The AC signal source AC1 and the resistors R1P and R1N correspond to the driver 22 illustrated in FIG. 1. Each of the resistors R1P and R1N has a resistance value of 50Ω. The AC signal source AC2 corresponds to the signal generator 30 illustrated in FIG. 1. The capacitors C1P and C1N respectively correspond to the capacitors CP and CN illustrated in FIG. 1.

A circuit coupled to the output ends E2 of the wiring line pattern PAT includes resistors R2P and R2N. This circuit corresponds to the reception device 90 illustrated in FIG. 1. The resistors R2P and R2N correspond to a terminator of the receiver 91 illustrated in FIG. 1. Each of the resistors R2P and R2N has a resistance value of 50 Ω

In a case (case C1) where the AC signal source AC1 having a frequency of 4.5 GHz generates an AC signal having an amplitude of 1 V but the AC signal source AC2 generates no AC signal, a common-mode signal VCOM has a voltage amplitude of 29.6 mV at the points A. In other words, the AC signal generated by the AC signal source AC1 is converted into the common-mode signal VCOM through the mode conversion, and the common-mode signal VCOM fluctuates. At this time, the amount of electromagnetic radiation is −72.3 dBV/m at a location three meters away from the points A.

On the other hand, in a case (case C2) where the AC signal source AC1 having a frequency of 4.5 GHz generates an AC signal having an amplitude of 1 V and the AC signal source AC2 having a frequency of 4.5 GHz generates an AC signal that has a certain amplitude and a certain phase, a common-mode signal VCOM has a voltage amplitude of 0.3 mV at the points A. In other words, it is possible to suppress the fluctuation in the common-mode signal VCOM to some extent at the points A, by superimposing the AC signal generated by the AC signal source AC2 on the AC signal generated by the AC signal source AC1. At this time, the amount of electromagnetic radiation is −79.4 dBV/m at the location three meters away from the points A. As described above, the amount of electromagnetic radiation is improved by approximately 7 dBV/m by superimposing the AC signal generated by the AC signal source AC2.

FIG. 13 and FIG. 14 illustrate electric near fields that are located 5 cm above the wiring line pattern PAT. FIG. 13 illustrates the case C1, and FIG. 14 illustrates the case C2. The wiring line pattern PAT extends in a Y direction. FIG. 13 and FIG. 14 illustrate magnitude of the electric fields in an X-axis direction by using contour lines. In particular, FIG. 13 and FIG. 14 use stippling to represent portions with a higher electric field value than a certain value.

In the case C1, the AC signal source AC2 generates no AC signal. Therefore, the common-mode signal fluctuates due to the mode conversion. This causes the portions with higher electric near fields along a Y-axis as illustrated in FIG. 13.

On the other hand, in the case C2, the fluctuation in the common-mode signal VCOM is suppressed when generating an AC signal by the AC signal source AC2 and superimposing the AC signal generated by the AC signal source AC2 on the AC signal generated by the AC signal source AC1. This makes it possible to make the magnitude of electric near fields smaller as illustrated in FIG. 14.

As described above, it is possible to reduce the common-mode noise NC and reduce the amount of electromagnetic radiation, by superimposing the AC signal generated by the AC signal source AC2 on the AC signal generated by the AC signal source AC1. In a similar way, in the communication system 1 illustrated in FIG. 1, it is also possible to reduce the common-mode noise NC and reduce the amount of electromagnetic radiation, by superimposing the AC signal VAC generated by the signal generator 30 on the signals SIGP and SIGN generated by the driver 22.

For example, gain G of the amplifier 37 for canceling the common-mode noise NC is represented by a following expression:

$$G \propto M/(\omega C)$$

where ω represents angular frequency of the AC signal VAC, G represents gain of the amplifier 37 at the angular frequency of the AC signal VAC, C represents capacitance values of the capacitors CP and CN, and M represents a conversion factor for the mode conversion from the differential mode to the common mode.

For example, the common-mode noise NC increases as the conversion factor M for the mode conversion gets higher. Therefore, for canceling the common-mode noise NC, it is necessary to increase the amplitude of the AC signal VAC as the conversion factor M for the mode conversion gets higher. Accordingly, the gain G of the amplifier 37 is proportional to the conversion factor M.

In addition, the AC signal VAC generated by the signal generator 30 is superimposed on the signals SIGP and SIGN via the capacitors CP and CN. A ratio of superimposing the AC signal VAC on the signals SIGP and SIGN varies depending on impedance (1/jωC) of the capacitors CP and CN. For example, the AC signal VAC is more likely to be superimposed on the signals SIGP and SIGN as the impedance decreases. In other words, the AC signal VAC is more likely to be superimposed on the signals SIGP and SIGN as (ωC) increases. Therefore, it is necessary to make the amplitude of the AC signal VAC smaller as (ωC) increases. In such a way, the gain G of the amplifier 37 is inversely proportional to (ωC).

As described above, the gain G of the amplifier 37 for canceling the common-mode noise NC is proportional to the conversion factor M for the mode conversion, is inversely proportional to the angular frequency of the AC signal, and is inversely proportional to the capacitance values C of the capacitors CP and CN. The transmission device 10 makes it possible to cancel the common-mode noise NC by setting such gain G.

For example, prior to shipment of products, it is possible to monitor the common-mode noise NC generated due to the mode conversion near the coupling points between the package wiring lines W1 and the PCB wiring lines W2 in the transmission device 10, and set the phase, frequency, and amplitude of the AC signal VAC on the basis of a result of the monitoring in such a manner that sufficiently small common-mode noise NC is obtained. Specifically, the transmission device 10 adjust the frequency of the AC signal VAC by adjusting the frequency of the clock signal CK3 generated by the frequency divider circuit 35 on the basis of the frequency of the common-mode noise NC generated due to the mode conversion. In addition, the amplitude of the AC signal VAC is adjusted by adjusting the gain of the amplifier 37. In addition, the phase of the AC signal VAC is adjusted by adjusting the amount of delay of the delay circuit 31. Moreover, the memory 39 stores setting data of the amount of delay in the delay circuit 31, setting data of the frequency in the frequency divider circuit 35, and setting data of the gain in the amplifier 37. This allows the communication system 1 to reduce the common-mode noise NC and reduce the electromagnetic radiation.

It is to be noted that though the common-mode noise NC generated due to the mode conversion near the coupling points is monitored in this example, the present disclosure is not limited thereto. Instead, for example, it may be possible to monitor an electric near field located above a vicinity of the coupling points between the package wiring lines W1 and the PCB wiring lines W2 by using an EMI tester prior to shipment of products, and set the phase, frequency, and amplitude of the AC signal VAC in such a manner that sufficiently small electric near field is obtained.

The transmission device 10 includes the driver 22, the AC signal generator (the delay circuit 31, the phase comparator circuit 32, the loop filter 33, the oscillator circuit 34, the frequency divider circuit 35, and the filter 36), the amplifier 37, and the capacitors CP and CN. The AC signal generator includes the phase-locked loop circuit that generates an AC signal, the AC signal generator being configured to set the phase and frequency of the AC signal. The amplifier 37 is configured to amplify the AC signal generated by the AC signal generator and set the amplitude of the AC signal. The capacitors CP and CN are configured to superimpose the AC signal amplified by the amplifier 37 on the signals SIGP and SIGN, respectively. This allows the transmission device 10 to superimpose the generated AC signal VAC on the signals SIGP and SIGN generated by the driver 22. Accordingly, it is possible to reduce the common-mode noise NC and reduce the electromagnetic radiation, for example.

[Effects]

As described above, the driver, the AC signal generator, the amplifier, and the capacitors are included according to the present embodiment. The AC signal generator includes the phase-locked loop circuit that generates an AC signal, the AC signal generator being configured to set the phase and frequency of the AC signal. The amplifier is configured to amplify the AC signal generated by the AC signal generator and set the amplitude of the AC signal. The capacitors are configured to superimpose the AC signal amplified by the amplifier on the respective signals. This makes it possible to reduce the electromagnetic radiation.

[Modification 1]

In the above-described embodiment, the delay circuit 31 is disposed upstream of the phase comparator circuit 32 as illustrated in FIG. 1. However, the present disclosure is not limited thereto. Instead, for example, the delay circuit may be disposed downstream of the frequency divider circuit 35 like a communication system 1F illustrated in FIG. 15. The communication system 1F includes a transmission device 10F. The transmission device 10F includes a signal generator 30F. The signal generator 30F includes a delay circuit 31F. The delay circuit 31F is configured to delay the clock signal CK3 supplied from the frequency divider circuit 35 by an amount of delay corresponding to the control signal CTLD. The phase comparator circuit 32 receives the reference clock signal REFCK and the clock signal CK2 generated by the frequency divider circuit 35.

[Modification 2]

In the above-described embodiment, the filter 36 is installed as illustrated in FIG. 1. However, the present disclosure is not limited thereto. Instead, for example, the filter 36 may be omitted like a communication system 1G illustrated in FIG. 16. The communication system 1G includes a transmission device 10G. The transmission device 10G includes a signal generator 30G. The signal generator 30G is configured by omitting the filter 36 from the signal generator 30 (FIG. 1) according to the above-described embodiment. In this case, an AC signal VAC includes a harmonic component in addition to a fundamental component. The filter 36 may be omitted as described above in a case where the AC signal VAC has less impact on characteristics of the communication system 1G even if the AC signal VAC includes the harmonic component.

Alternatively, for example, it is also possible for the frequency divider circuit 35 to generate a clock signal CK3 including a reduced harmonic component when the frequency divider circuit 35 is configured by using an analog circuit such as current mode logic (CML). It is possible to omit the filter 36 also in this case.

[Modification 3]

In the above-described embodiment, the present technology is applied to the communication system 1 that transmits data by using the differential signal. However, the present disclosure is not limited thereto. For example, it is also possible to apply the present technology to a communication system that uses three or more signals to transmit data. Next, details thereof will be described with reference to a communication system 1C that uses three or more signals to transmit data.

FIG. 17 illustrates a configuration example of a communication system 1H. The communication system 1H includes a transmission device 10H, a communication channel 180, and a reception device 90H. The communication channel 180 includes lines 180A, 180B, and 180C. The communication system 1H transmits signals SIGA, SIGB, and SIGC via the communication channel 180. Each of the signals SIGA, SIGB, and SIGC transitions between three voltage levels (high-level voltage VH, middle-level voltage VM, and low-level voltage VL).

FIG. 18 illustrates voltage states of the signals SIGA, SIGB, and SIGC. The transmission device 10 transmits six symbols including "+x", "−x", "+y", "−y", "+z", "−z" by using the three signals SIGA, SIGB, and SIGC. For example, in a case of transmitting the symbol "+x", the transmission device 10H sets the signal SIGA to the high-level voltage VH, sets the signal SIGB to the low-level voltage VL, and set the signal SIGC to the middle-level voltage VM. In a case of transmitting the symbol "−x", the transmission device 10H sets the signal SIGA to the low-level voltage VL, sets the signal SIGB to the high-level voltage VH, and set the signal SIGC to the middle-level voltage VM. In a case of transmitting the symbol "+y", the transmission device 10H sets the signal SIGA to the middle-level voltage VM, sets the signal SIGB to the high-level voltage VH, and set the signal SIGC to the low-level voltage VL. For example, in a case of transmitting the symbol "−y", the transmission device 10H sets the signal SIGA to the middle-level voltage VM, sets the signal SIGB to the low-level voltage VL, and set the signal SIGC to the high-level voltage VH. In a case of transmitting the symbol "+z", the transmission device 10H sets the signal SIGA to the low-level voltage VL, sets the signal SIGB to the middle-level voltage VM, and set the signal SIGC to the high-level voltage VH. In a case of transmitting the symbol "−z", the transmission device 10H sets the signal SIGA to the high-level voltage VH, sets the signal SIGB to the middle-level voltage VM, and set the signal SIGC to the low-level voltage VL. When using such signals SIGA, SIGB, and SIGC, average values of voltage levels in the respective symbols indicated by the three signals are equal to each other.

The transmission device 10H (FIG. 17) includes a transmitter 20H, the signal generator 30, and capacitors CA, CB, and CC.

The transmitter 20H includes a transmission data generator 21H and a driver 22H. The transmission data generator 21H is configured to generate transmission data to be transmitted to the reception device 90H. The driver 22H is configured to transmit the signals SIGA, SIGB, and SIGC on the basis of the transmission data generated by the transmission data generator 21H. Specifically, the driver 22H transmits the signal SIGA to the reception device 90H via the line 180A, transmits the signal SIGB to the reception device 90H via the line 180B, and transmits the signal SIGC to the reception device 90H via the line 180C.

One end of the capacitor CA is coupled to an output node of the signal SIGA, and another end of the capacitor CA is coupled to the output terminal of the amplifier 37. One end of the capacitor CB is coupled to an output node of the signal SIGB, and another end of the capacitor CB is coupled to the output terminal of the amplifier 37. One end of the capacitor CC is coupled to an output node of the signal SIGC, and another end of the capacitor CC is coupled to the output terminal of the amplifier 37. Such a configuration allows the capacitors CA, CB, and CC to superimpose the AC signal VAC generated by the signal generator 30 on the signals SIGA, SIGB, and SIGC, respectively.

The reception device 90H is configured to receive the signals SIGA, SIGB, and SIGC that are transmitted from the transmission device 10H via the communication channel 180. The reception device 90H includes a receiver 91H. The receiver 91H is configured to receive the signals SIGA, SIGB, and SIGC.

[Modification 3]

In the above-described embodiment, the phase, frequency, and amplitude of the AC signal VAC is set prior to shipment of products, for example. However, the present disclosure is not limited thereto. Instead, for example, the phase, frequency, and amplitude of the AC signal VAC may be set when the communication system operates. Next, the present modification will be described with reference to several examples.

FIG. 19 illustrates a configuration example of a communication system 1J according to the present modification. The communication system 1J includes a transmission device 10J, the communication channel 80, and a reception device 90J.

The transmission device 10J includes a signal generator 30J and a controller 19J. The signal generator 30J is configured to generate an AC signal VAC on the basis of a reference clock signal REFCK in a way similar to the signal generator 30 (FIG. 1) according to the above-described embodiment. The signal generator 30J makes it possible to set the phase, frequency, and amplitude of the AC signal VAC in response to an instruction from the controller 19J.

The controller 19J is configured to set the phase, frequency, and amplitude of the AC signal VAC on the basis of a detection signal DET supplied from the reception device 90J.

The reception device 90J includes a detector 99J. The detector 99J is configured to detect common-mode noise NC of signals SIGP and SIGN transmitted from the transmission device 10J. In addition, the detector 99J is configured to transmit the detection signal DET to the transmission device 10J, the detection signal DET corresponding to an amount of noise in the detected common-mode noise NC.

FIG. 20 illustrates an operation example of the communication system 1J. The communication system 1D performs a following operation when performing a process of establishing a communication link, for example.

The transmission device 10J first selects one of a plurality of combinations of settings related to the phase, frequency, and amplitude of the AC signal VAC, and configures settings for the delay circuit 31, the frequency divider circuit 35, and the amplifier 37 of the signal generator 30J on the basis of the selected combination (Step S101). Specifically, the controller 19J selects one of the plurality of combinations of settings related to the phase, frequency, and amplitude of the AC signal VAC. Next, the setting section 38 of the signal generator 30J generates control signals CTLD, CTLF, and CTLG on the basis of the selected combination. The delay circuit 31 of the signal generator 30J generates a clock signal CK1 by delaying a reference clock signal REFCK by an amount of delay corresponding to a control signal CTLP. The frequency divider circuit 35 outputs a clock signal CK3 that is frequency-divided at a frequency division ratio corresponding to the control signal CTLF, on the basis of the control signal CTLF. The amplifier 37 amplifies a signal supplied from the filter 36 by gain corresponding to the control signal CTLG and generates the AC signal VAC. The capacitors CP and CN superimpose the AC signal VAC generated by the signal generator 30J as described above, on the signals SIGP and SIGN, respectively.

Next, the detector 99J of the reception device 90J detects common-mode noise NC of the signals SIGP and SIGN transmitted from the transmission device 10J (Step S102). In addition, the detector 99J transmits information regarding an amount of noise in the detected common-mode noise NC to the controller 19J of the transmission device 10J, by using a detection signal DET.

The controller 19J checks whether the all combinations of settings related to the phase, frequency, and amplitude of the AC signal VAC have been selected (Step S103). In a case where not all the combinations have been selected yet ("N" in Step S103), the transmission device 10J selects one of the combinations that have not been selected yet, and configures settings for the delay circuit 31, the frequency divider circuit 35, and the amplifier 37 of the signal generator 30J on the basis of the selected combination (Step S104). Next, the process returns to Step S102. The transmission device 10J repeats the processes in Step S102 to Step S104 until the all combinations have been selected.

In a case where all the combinations have been selected ("Y" in Step S103), the controller 19J determines a combination having the lowest common-mode noise NC among the plurality of combinations of settings related to the phase, frequency, and amplitude of the AC signal VAC, on the basis of the amounts of noise in the common-mode noise NC (Step S105).

Next, the setting section 38 of the signal generator 30J configures settings for the delay circuit 31, the frequency divider circuit 35, and the amplifier 37 on the basis of the determined combination (Step S106).

Subsequently, the process ends.

It is to be noted that though the detector 99J is installed in the reception device 90J in the above-described example, the present disclosure is not limited thereto. For example, the detector 99J may be installed in the transmission device 10J but outside the package 110 (FIG. 5). Even in this case, it is possible to reduce the common-mode noise NC caused by the mode conversion in the package wiring lines W1.

FIG. 21 illustrates a configuration example of a communication system 1K according to the present modification. The communication system 1K includes the transmission device 10J, the communication channel 80, a sensor 81K, and the reception device 90.

The sensor 81K is a sensor that detects the electromagnetic radiation, and includes an antenna, for example. The sensor 81K is configured to transmit the detection signal DET to the transmission device 10J, the detection signal DET corresponding to the amount of detected electromagnetic radiation. The sensor 81K is disposed near the communication channel 80. The sensor 81K may be disposed near the transmission device 10J or near the reception device 90. The communication system 1K operates in a way similar to the communication system 1J FIG. 20).

[Modification 4]

In the above-described embodiment, a single set of the signal generator 30 and the capacitors CP and CN is prepared. However, the present disclosure is not limited thereto. For example, as illustrated in FIG. 22, a plurality of sets (two set in this example) of the signal generator 30 and the capacitors CP and CN may be installed in a transmission device 10L. The transmission device 10L includes two signal generators 30 (signal generators 301 and 302) and capacitors CP1, CN1, CP2, and CN2. One end of the capacitor CP1 is coupled to the node NP, and another end of the capacitor CP1 is coupled to an output terminal of the amplifier 37 of the signal generator 301. One end of the capacitor CN1 is coupled to the node NN, and another end of the capacitor CN1 is coupled to the output terminal of the amplifier 37 of the signal generator 301. The capacitors CP1 and CN1 superimpose an AC signal VAC generated by the signal generator 301 on signals SIGP and SIGN. One end of the capacitor CP2 is coupled to the node NP, and another end of the capacitor CP2 is coupled to an output terminal of the amplifier 37 of the signal generator 302. One end of the capacitor CN2 is coupled to the node NN, and another end of the capacitor CN2 is coupled to the output terminal of the amplifier 37 of the signal generator 302. The capacitors CP2 and CN2 superimpose an AC signal VAC generated by the signal generator 302 on the signals SIGP and SIGN. The signal generator 301 and the signal generator 302 make it possible to generate the AC signals VAC that are different from each other. This allows the transmission device 10F to reduce two common-mode noises NC having different frequencies.

[Modification 5]

In the above-described embodiment, the signal generator 30 includes the phase-locked loop circuit (the phase comparator circuit 32, the loop filter 33, the oscillator circuit 34, and the frequency divider circuit 35), and generates the AC signal VAC by using the phase-locked loop circuit. However, the present disclosure is not limited thereto. Instead, for example, the AC signal VAC may be generated by using the phase-locked loop circuit of the transmitter like a communication system 1M illustrated in FIG. 23. The communication system 1M includes a transmission device 10M. The transmission device 10M includes a transmitter 20M and a signal generator 30M.

The transmitter 20M includes a phase comparator circuit 32M, a loop filter 33M, an oscillator circuit 34M, a frequency divider circuit 35M, and a transmission data generator 21M. The phase comparator circuit 32M, the loop filter 33M, the oscillator circuit 34M, and the frequency divider circuit 35M correspond to the phase comparator circuit 32, the loop filter 33, the oscillator circuit 34, and the frequency divider circuit 35 according to the above-described embodiment, and they are included in the phase-locked loop circuit. The phase-locked loop circuit generates the clock signal CK0. The transmission data generator 21M is configured to generate transmission data to be transmitted to the reception device 90, on the basis of the clock signal CK0.

The signal generator 30M includes a delay circuit 31M, the filter 36, the amplifier 37, and the setting section 38. The delay circuit 31M is configured to delay the clock signal CK3 supplied from the frequency divider circuit 35 by an amount of delay corresponding to the control signal CTLD.

[Other Modifications]

Moreover, two or more of the above-described modifications may be combined.

The present technology has been described above with reference to the embodiment and the several modifications. However, the present technology is not limited thereto, and various kinds of modifications thereof can be made.

For example, in the above-described embodiment or the like, the present technology is applied to the communication system 1 that transmits data by using the differential signals. However, the present disclosure is not limited thereto. The present disclosure is also applicable to a communication system that transmits data by using three or more signals. The present technology is applicable in a case where average values of voltage levels in respective symbols indicated by three signals are equal to each other.

It is to be noted that the effects described herein are only for illustrative purposes and there may be other effects.

It is to be noted that the present technology may also have the following configurations. According to the present technology having configurations, it is possible to reduce electromagnetic radiation.

(1)

A transmission device including:

a driver that transmits a transmission signal including two or more signals;

an alternating current signal generator including a phase-locked loop circuit that generates an alternating current signal, the alternating current signal generator being configured to set a phase and frequency of the alternating current signal;

an amplifier configured to amplify the alternating current signal generated by the alternating current signal generator and set amplitude of the alternating current signal; and a superimposer that superimposes the alternating current signal amplified by the amplifier on the two or more signals.

(2)

The transmission device according to (1), further including a storage that stores setting data of the phase of the alternating current signal, setting data of the frequency of the alternating current signal, and setting data of the amplitude of the alternating current signal.

(3)

The transmission device according to (1) or (2), in which the phase-locked loop circuit includes a phase comparator circuit that compares a phase of a first alternating current signal with a phase of a second alternating current signal, a loop filter that generates control voltage corresponding to a result of comparison made by the phase comparator circuit, an oscillator circuit that generates an oscillating signal having a frequency corresponding to the control voltage, and a frequency divider circuit that generates the second alternating current signal by frequency-dividing the oscillating signal at a predetermined frequency division ratio, generates a plurality of alternating current signals by frequency-dividing the oscillating signal, and selects one of the plurality of alternating current signals as the alternating current signal.

(4)

The transmission device according to (3), further including a data generator that generates transmission data on a basis of the oscillating signal, in which the driver transmits the transmission signal on a basis of the transmission data.

(5)

The transmission device according to (3), in which the alternating current signal generator sets the phase of the alternating current signal by delaying the first alternating current signal.

(6)

The transmission device according to (1), in which the alternating current signal generator sets the phase of the alternating current signal by delaying the alternating current signal.

(7)

The transmission device according to any of (1) to (6), in which the transmission signal includes two signals, and the two signals include a differential signal.

(8)

The transmission device according to (7), in which the superimposer includes a first capacitor including a first terminal and a second terminal, the first terminal being coupled to a first node out of the first node and a second node that receive the respective two signals outputted from the driver, the second terminal receiving the alternating current signal, and a second capacitor including a first terminal and a second terminal, the first terminal being coupled to the second node, the second terminal receiving the alternating current signal.

(9)

The transmission device according to any of (1) to (6), in which the transmission signal includes three signals, the three signals transition between three voltage levels, and the three signals have different voltage levels from each other.

(10)

The transmission device according to (9), in which the superimposer includes a first capacitor including a first terminal and a second terminal, the first terminal being coupled to a first node out of the first node, a second node, and a third node that receive the respective three signals outputted from the driver, the second terminal receiving the alternating current signal, a second capacitor including a first terminal and a second terminal, the first terminal being coupled to the second node, the second terminal receiving the alternating current signal, and a third capacitor including a first terminal and a second terminal, the first terminal being coupled to the third node, the second terminal receiving the alternating current signal.

(11)

The transmission device according to any of (1) to (10), in which average values of voltage levels in respective symbols indicated by the two or more signals are equal to each other.

(12)

The transmission device according to any of (1) to (11) in which the driver, the alternating current signal generator, the amplifier, and the superimposer are disposed on a semiconductor chip.

(13)

The transmission device according to any of (1) to (11), in which the driver, the alternating current signal generator, and the amplifier are disposed on a semiconductor chip, and the superimposer is disposed outside the semiconductor chip.

(14)

The transmission device according to any of (1) to (11), in which the driver is disposed on a first semiconductor chip, the alternating current signal generator and the amplifier are disposed on a second semiconductor chip, and the superimposer is disposed outside the first semiconductor chip and the second semiconductor chip.

(15)

A communication system including:

a transmission device that transmits a transmission signal including two or more signals; and a reception device that receives the transmission signal, in which the transmission device includes a driver that transmits the transmission signal, an alternating current signal generator including a phase-locked loop circuit that generates an alternating current signal, the alternating current signal generator being configured to set a phase and frequency of the alternating current signal, an amplifier configured to amplify the alternating current signal generated by the alternating current signal generator and set amplitude of the alternating current signal, and a superimposer that superimposes the alternating current signal amplified by the amplifier on the two or more signals.

(16)

The communication system according to (15), further including a detector that performs detection of common-mode noise included in the transmission signal, in which the transmission device further includes a controller that controls the phase of the alternating current signal, the frequency of the alternating current signal, and the amplitude of the alternating current signal on a basis of a result of the detection performed by the detector.

(17)

The communication system according to (16), in which the reception device includes the detector.

(18)

The communication system according to (15), further including a sensor that performs detection of an electromagnetic wave corresponding to the transmission signal, in which the transmission device further includes a controller that controls the phase of the alternating current signal, the frequency of the alternating current signal, and the amplitude of the alternating current signal on a basis of a result of the detection performed by the sensor.

The present application claims the benefit of Japanese Priority Patent Application JP2021-013768 filed with the Japan Patent Office on Jan. 29, 2021, the entire contents of which are incorporated herein by reference.

It should be understood by those skilled in the art that various modifications, combinations, sub-combinations and alternations may occur depending on design requirements and other factors insofar as they are within the scope of the appended claims or the equivalents thereof.

The invention claimed is:

1. A transmission device, comprising:
   a driver configured to transmit a transmission signal that includes at least two signals;
   an alternating current signal generator that includes a phase-locked loop circuit, wherein the alternating current signal generator is configured to:
      generate a first alternating current signal of a plurality of alternating current signals;
      set a first phase of the first alternating current signal; and
      set a frequency of the first alternating current signal;
   an amplifier configured to:
      amplify the first alternating current signal generated by the alternating current signal generator; and
      set an amplitude of the first alternating current signal; and
   a superimposer that includes at least two capacitors, wherein the at least two capacitors are configured to superimpose the first alternating current signal amplified by the amplifier on the at least two signals.

2. The transmission device according to claim 1, further comprising a storage configured to store first setting data of the first phase of the first alternating current signal, second setting data of the frequency of the first alternating current signal, and third setting data of the amplitude of the first alternating current signal.

3. The transmission device according to claim 1, wherein the phase-locked loop circuit includes:
   a phase comparator circuit configured to compare the first phase of the first alternating current signal with a second phase of a second alternating current signal of the plurality of alternating current signals;
   a loop filter configured to generate control voltage corresponding to a result of the comparison;
   an oscillator circuit configured to generate an oscillating signal that has a specific frequency corresponding to the control voltage; and
   a frequency divider circuit configured to:
      execute frequency-dividing operation on the oscillating signal at a specific frequency division ratio;
      generate the second alternating current signal based on the frequency-dividing operation;
      generate the plurality of alternating current signals based on the frequency-dividing operation; and
      select one of the plurality of alternating current signals as a third alternating current signal.

4. The transmission device according to claim 3, further comprising a data generator configured to generate transmission data based on the oscillating signal, wherein the driver is further configured to transmit the transmission signal based on the transmission data.

5. The transmission device according to claim 3, wherein the alternating current signal generator is further configured to set the first phase of the first alternating current signal based on a delay of the first alternating current signal.

6. The transmission device according to claim 1, wherein the alternating current signal generator is further configured to set the first phase of the first alternating current signal based on a delay of the first alternating current signal.

7. The transmission device according to claim 1, wherein the transmission signal includes two signals of the at least two signals, and each of the two signals includes a differential signal.

8. The transmission device according to claim 7, wherein the driver is further configured to output one of the two signals to a first node and a second node, and the at least two capacitors include:
   a first capacitor that includes a first terminal and a second terminal, wherein
      the first terminal of the first capacitor is coupled to the first node, and
      the second terminal of the first capacitor is configured to receive the first alternating current signal; and
   a second capacitor that includes a first terminal and a second terminal, wherein
      the first terminal of the second capacitor is coupled to the second node, and
      the second terminal of the second capacitor is configured to receive the first alternating current signal.

9. The transmission device according to claim 1, wherein the transmission signal includes three signals including the at least two signals, each of the three signals transition between one of three voltage levels, and each of the three signals has a different voltage level.

10. The transmission device according to claim 9, wherein the driver is further configured to output one of the three signals to a first node, a second node, and a third node; and the at least two capacitors include
   a first capacitor that includes a first terminal and a second terminal, wherein
      the first terminal of the first capacitor is coupled to the first node, and
      the second terminal of the first capacitor is configured to receive the first alternating current signal;

a second capacitor that includes a first terminal and a second terminal, wherein
the first terminal of the second capacitor is coupled to the second node, and
the second terminal of the second capacitor is configured to receive the first alternating current signal; and
a third capacitor that includes a first terminal and a second terminal, wherein
the first terminal of the third capacitor is coupled to the third node, and
the second terminal of the third capacitor is configured to receive the first alternating current signal.

11. The transmission device according to claim 1, wherein average value of voltage levels in a first symbol is equal to average value of voltage levels in a second symbol, and the at least two signals indicate each of the first symbol and the second symbol.

12. The transmission device according to claim 1, wherein the driver, the alternating current signal generator, the amplifier, and the superimposer are on a semiconductor chip.

13. The transmission device according to claim 1, wherein the driver, the alternating current signal generator, and the amplifier are on a semiconductor chip, and
the superimposer is outside the semiconductor chip.

14. The transmission device according to claim 1, wherein the driver is on a first semiconductor chip,
the alternating current signal generator and the amplifier are on a second semiconductor chip, and
the superimposer is outside the first semiconductor chip and the second semiconductor chip.

15. A communication system, comprising:
a transmission device configured to transmit a transmission signal that includes at least two signals; and
a reception device configured to receive the transmission signal, wherein the transmission device includes:
a driver configured to transmit the transmission signal;
an alternating current signal generator includes a phase-locked loop circuit, wherein the alternating current signal generator is configured to:
generate an alternating current signal; and
set a phase of the alternating current signal and a frequency of the alternating current signal;
an amplifier configured to:
amplify the alternating current signal generated by the alternating current signal generator; and
set an amplitude of the alternating current signal; and
a superimposer that includes at least two capacitors, wherein the at least two capacitors are configured to superimpose the alternating current signal amplified by the amplifier on the at least two signals.

16. The communication system according to claim 15, further comprising a detector configured to detect common-mode noise in the transmission signal, wherein
the transmission device further includes a controller configured to control, based on the detection of the common-mode noise, the phase of the alternating current signal, the frequency of the alternating current signal, and the amplitude of the alternating current signal.

17. The communication system according to claim 16, wherein the reception device includes the detector.

18. The communication system according to claim 15, further comprising a sensor configured to detect an electromagnetic wave corresponding to the transmission signal, wherein
the transmission device further includes a controller configured to control, based on the detection of the electromagnetic wave, the phase of the alternating current signal, the frequency of the alternating current signal, and the amplitude of the alternating current signal.

* * * * *